(12) United States Patent
Huang et al.

(10) Patent No.: US 11,532,759 B2
(45) Date of Patent: Dec. 20, 2022

(54) CAPPING STRUCTURES FOR GERMANIUM-CONTAINING PHOTOVOLTAIC COMPONENTS AND METHODS OF FORMING THE SAME

(71) Applicant: Taiwan Semiconductor Manufacturing Company Limited, Hsinchu (TW)

(72) Inventors: Chen-Hao Huang, Taoyuan (TW); Hau-Yan Lu, Hsinchu (TW); Sui-Ying Hsu, New Taipei (TW); Yuehying Lee, Hsinchu (TW); Chien-Ying Wu, Hsinchu (TW); Chia-Ping Lai, Hsinchu (TW)

(*) Notice: Subject to any disclaimer, the term of this patent is extended or adjusted under 35 U.S.C. 154(b) by 0 days.

(21) Appl. No.: 17/159,359

(22) Filed: Jan. 27, 2021

(65) Prior Publication Data
US 2022/0238730 A1    Jul. 28, 2022

(51) Int. Cl.
| | |
|---|---|
| H01L 31/0203 | (2014.01) |
| H01L 31/0312 | (2006.01) |
| H01L 31/18 | (2006.01) |
| H01L 31/103 | (2006.01) |
| H01L 31/105 | (2006.01) |
| H01L 31/0352 | (2006.01) |

(52) U.S. Cl.
CPC ...... *H01L 31/0203* (2013.01); *H01L 31/0312* (2013.01); *H01L 31/035281* (2013.01); *H01L 31/105* (2013.01); *H01L 31/1037* (2013.01); *H01L 31/1812* (2013.01)

(58) Field of Classification Search
CPC ............ H01L 31/0203; H01L 31/0312; H01L 31/035281; H01L 31/1037; H01L 31/105; H01L 31/1812
See application file for complete search history.

(56) References Cited

U.S. PATENT DOCUMENTS

2017/0317221 A1* 11/2017 Usami ................ G02B 6/12004

* cited by examiner

*Primary Examiner* — Hoang-Quan Ho
(74) *Attorney, Agent, or Firm* — The Marbury Law Group, PLLC

(57) ABSTRACT

At least one doped silicon region is formed in a silicon layer of a semiconductor substrate, and a silicon oxide layer is formed over the silicon layer. A germanium-containing material portion is formed in the semiconductor substrate to provide a p-n junction or a p-i-n junction including the germanium-containing material portion and one of the at least one doped silicon region. A capping material layer that is free of germanium is formed over the germanium-containing material portion. A first dielectric material layer is formed over the silicon oxide layer and the capping material layer. The first dielectric material layer includes a mesa region that is raised from the germanium-containing material portion by a thickness of the capping material layer. The capping material layer may be a silicon capping layer, or may be subsequently removed to form a cavity. Dark current is reduced for the germanium-containing material portion.

20 Claims, 30 Drawing Sheets

CAPPING STRUCTURES FOR GERMANIUM-CONTAINING PHOTOVOLTAIC COMPONENTS AND METHODS OF FORMING THE SAME

BACKGROUND

Germanium is used to form various semiconductor devices such as complementary metal-oxide-semiconductor image sensors (CIS) and charge-coupled device (CCD) sensors. CIS and CCD are employed to generate two-dimensional images at a high frame rate and/or under weak lighting conditions. Germanium can be employed for CIS or CCD to provide high sensitivity to light.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
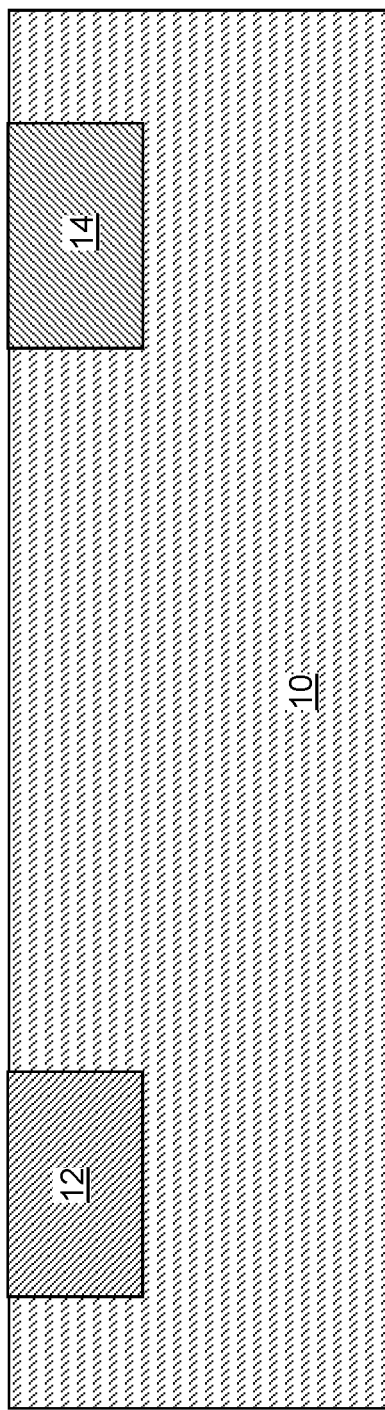
FIGS. 1A-1E are sequential vertical cross-sectional views for a first exemplary structure according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Germanium has a smaller band gap compared to silicon. As a result, germanium provides enhanced photosensitivity to light as compared to silicon. For this reason, germanium-containing material portions are used in many photovoltaic devices such as complementary metal-oxide semiconductor image sensors (CIS) and charge-coupled device (CCD) sensors. However, interfaces between germanium and insulating material layers such as silicon oxide or silicon nitride generate a high level of dark current, which adds to the background electrical noise in the photovoltaic devices. Dark current is the relatively small electrical current that flows through photosensitive devices such as a photomultiplier tube, photodiode, or charge-coupled device (CCD device) even when no photons are entering the device (i.e., in the dark). Dark current may consist of the charges generated in the detector when no outside radiation is entering the detector. The dark current has the effect of decreasing the signal-to-noise ratio in photovoltaic devices including germanium.

According to an aspect of the present disclosure, semiconductor devices including a germanium-containing material portion are provided in which interfaces between the germanium-containing material portion and silicon nitride are eliminated. In one embodiment, the germanium-containing material portion contacts only silicon or silicon oxide within a semiconductor substrate. For example, the germanium-containing material portion may be embedded in a silicon layer, and may be capped with a silicon capping layer. Alternatively, the germanium-containing material portion may be embedded in a silicon layer, and may be covered with a cavity to avoid formation of an interface with a dielectric material layer. The various aspects of the present disclosure are now described in detail.

FIGS. 1A-1E are sequential vertical cross-sectional views for a first exemplary structure according to a first embodiment of the present disclosure. Referring to FIG. 1A, a first exemplary structure according to a first embodiment of the present disclosure is illustrated, which includes a semiconductor substrate including a silicon layer 10. The silicon layer 10 may include single crystalline silicon or polycrystalline silicon, and includes silicon atoms at an atomic percentage greater than 98%, such as greater than 99% and/or greater than 99.9%. In one embodiment, the silicon layer 10 may be an entirety or a portion of a commercially available silicon wafer. The silicon layer 10 may be intrinsic, or may be doped with dopants of a first conductivity type, which may be p-type or n-type. In one embodiment, the silicon layer 10 may comprise, and/or may consist essentially of, a single crystalline silicon material. In embodiments in which the silicon layer 10 is doped with dopants of the first conductivity type, the atomic concentration of the dopants of the first conductivity type may be in a range from $1.0 \times 10^{13}/cm^3$ to $1.0 \times 10^{18}/cm^3$, although lesser and greater atomic concentrations may also be used. The thickness of the silicon layer 10 may be in a range from 1 micron to 1 mm, although lesser and greater thicknesses may also be used.

At least one doped silicon region (12, 14) may be formed in the silicon layer 10 of the semiconductor substrate. The at least one doped silicon region (12, 14) may include at least one first doped silicon region 12 having a doping of the first conductivity type and/or at least one second doped silicon region 14 having a doping of the second conductivity type. The at least one doped silicon region (12, 14) may be formed by implantation of dopants of the first conductivity type and/or dopants of a second conductivity type (which is the opposite of the first conductivity type). The atomic concentration of electrical dopants in the at least one doped silicon region (12, 14) may be in a range from $1.0\times10^{15}/cm^3$ to $1.0\times10^{21}/cm^3$, although lesser and greater atomic concentrations may also be used. The locations and the depths of each of the at least one doped silicon region (12, 14) may be selected based on the device characteristics of semiconductor devices to be subsequently formed, which may include photovoltaic devices using a p-n junction or a p-i-n junction.

Figure 1B:
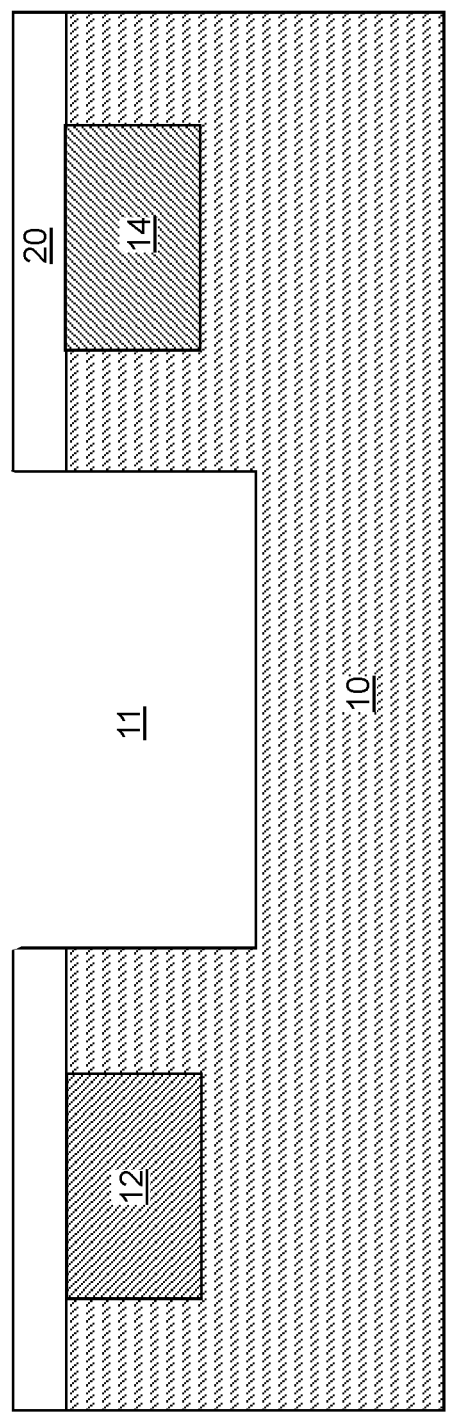

Referring to FIG. 1B, a silicon oxide layer 20 may be formed over the top surface of the silicon layer 10. The silicon oxide layer 20 may be formed by deposition of a silicon oxide material, for example, by chemical vapor deposition, or may be formed by conversion of surface portions of the silicon layer 10 and the at least one doped silicon region (12, 14) into silicon oxide, for example, by thermal oxidation. The thickness of the silicon oxide layer 20 may be in a range from 10 nm to 200 nm, although lesser and greater thicknesses may also be used.

A photoresist layer (not shown) may be applied over the silicon oxide layer 20, and may be lithographically patterned to form an opening therein. The opening in the photoresist layer may be located outside the areas of the at least one doped silicon region (12, 14), or may have a partial overlap with the areas of the at least one doped silicon region (12, 14). An anisotropic etch process may be performed to transfer the pattern of the opening in the photoresist layer into an upper portion of the silicon layer 10. A trench 11 may be formed through the silicon oxide layer 20 and an upper portion of the silicon layer 10. Sidewall(s) of the at least one doped silicon region (12, 14) may, or may not, be physically exposed to the trench 11. The depth of the trench 11 may be in a range from 200 nm to 10,000 nm, such as from 400 nm to 5,000 nm, although lesser and greater thicknesses may also be employed.

Figure 1C:
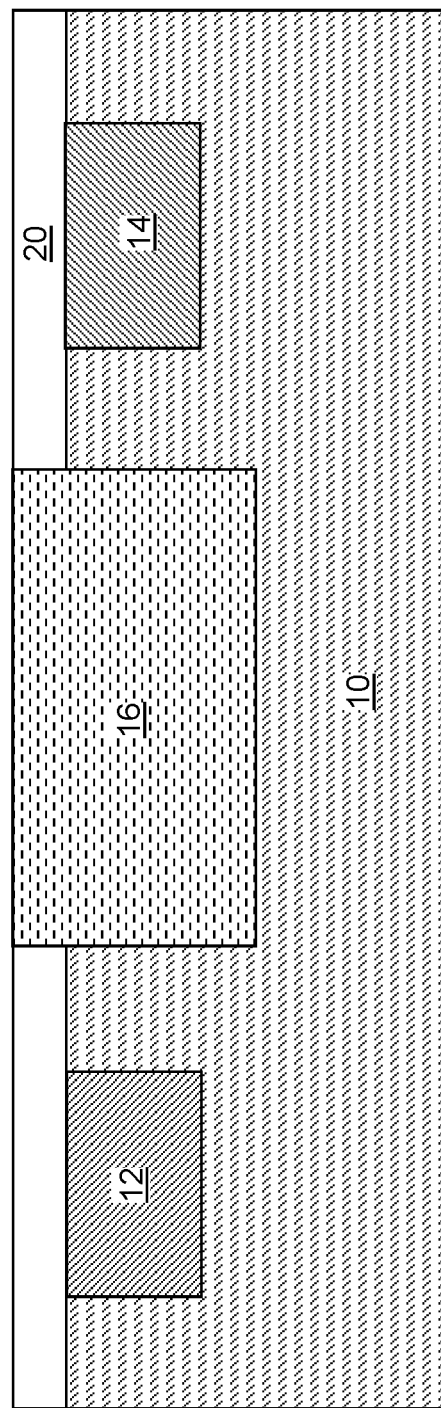

Referring to FIG. 1C, a germanium-containing material may be deposited in the trench 11 to fill the entire volume of the trench 11. The germanium-containing material may be a semiconductor material that includes germanium at an atomic percentage in a range from 0.1% to 100%, such as from 1% to 99.9% and/or from 10% to 90%. In one embodiment, the germanium-containing material may be p-doped or n-doped with an atomic concentration of electrical dopants in a range from $1.0\times10^{15}/cm^3$ to $1.0\times10^{21}/cm^3$, although lesser and greater atomic concentrations may also be used. In some embodiments, the germanium-containing material may include only germanium as a semiconductor element. In other embodiments, the germanium-containing material may include a silicon-germanium alloy. The germanium-containing material may be deposited as a single crystalline semiconductor material, a polycrystalline semiconductor material, or an amorphous semiconductor material. In one embodiment, the silicon layer 10 may include a single crystalline silicon material, and the germanium-containing material may include a single crystalline germanium-containing material in epitaxial alignment with the single crystalline silicon material. In one embodiment, the germanium-containing material may be deposited by a selective or non-selective epitaxial deposition process that deposits the germanium-containing material with epitaxial alignment with the single crystalline silicon material.

Excess portions of the germanium-containing material may be removed from above the horizontal plane including the top surface of the silicon oxide layer 20 by a planarization process. For example, a chemical mechanical polishing (CMP) process may be performed to remove portions of the germanium-containing material from above the horizontal plane including the top surface of the silicon oxide layer 20. A remaining portion of the germanium-containing material filling the trench 11 comprises a germanium-containing material portion 16. In one embodiment, a top surface of the germanium-containing material portion 16 may be within the horizontal plane including the top surface of the silicon oxide layer 20 (i.e., co-planar). The height of the germanium-containing material portion 16 may be in a range from 100 nm to 2,000 nm, such as from 150 nm to 1,000 nm, although lesser and greater heights may also be used.

Generally, a p-n junction or a p-i-n junction including the germanium-containing material portion 16 and one of the at least one doped silicon region (12, 14) may be formed. The p-n junction or the p-i-n junction may be used to provide a photovoltaic device in the first exemplary structure. In one embodiment, the germanium-containing material portion 16 comprises a single crystalline silicon-germanium alloy or a single crystalline germanium material portion, and is epitaxially aligned to a single crystalline silicon material within the silicon layer 10. In one embodiment, a periphery of the top surface of the germanium-containing material portion 16 may coincide with a closed periphery of a top surface of the silicon oxide layer 20.

Figure 1D:
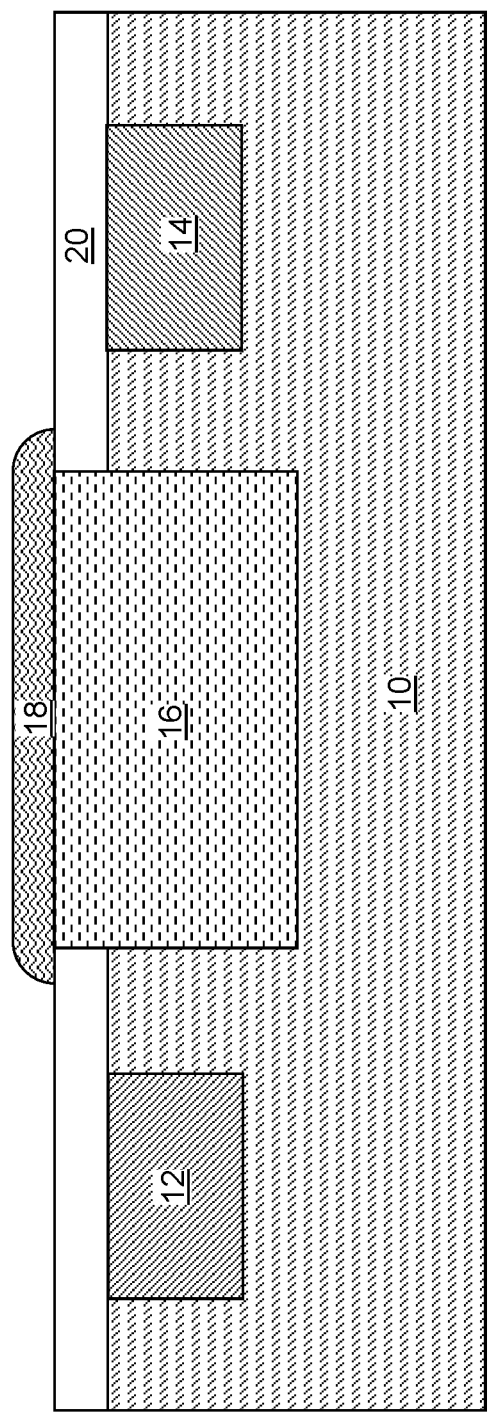

Referring to FIG. 1D, a capping material layer 18 that is free of germanium may be formed over the germanium-containing material portion 16 according to an embodiment of the present disclosure. The capping material layer 18 includes a material that minimizes generation of dark current at an interface between the capping material layer 18 and the germanium-containing material portion 16. The capping material layer 18 may be free of germanium (i.e., does not include germanium), or may be substantially free of germanium, i.e., may include germanium at an atomic concentration less than 1 part per million. In one embodiment, the capping material layer 18 may include, and/or may consist of, a silicon capping layer that includes silicon at an atomic concentration greater than 99%. The atomic concentration of silicon in the capping material layer 18 may be greater than 99.9%. In one embodiment, the capping material layer 18 may include amorphous silicon, polysilicon, or single crystalline silicon. In one embodiment, the capping material layer 18 may include strained silicon. In one embodiment, the capping material layer 18 may be doped with electrical dopants such as p-type dopants or n-type dopants. In one embodiment, the material composition of the top portion of the germanium-containing material portion 16 may be graded such that the atomic percentage of germanium in the top portion of the germanium-containing material portion 16 is less than the atomic percentage of germanium in an underlying portion of the germanium-containing material portion 16. In alternative embodiments, the capping material layer 18 may include a silicon-germanium alloy or a bilayer stack of a silicon-germanium layer and a silicon layer.

In one embodiment, the capping material layer 18 may have a uniform thickness, and may cover the entirety of the top surface of the germanium-containing material portion 16. In one embodiment, the area of the capping material layer 18 may be greater than the area of the top surface of the germanium-containing material portion 16. In one embodiment, the outer periphery of the capping material layer 18 may be laterally offset from an outer periphery of the germanium-containing material portion 16 by a lateral offset distance of at least 100 nm, which can be, for example, in a range from 100 nm to 1,000 nm.

In one embodiment, the capping material layer 18 may include a silicon capping layer that is formed by selective deposition of silicon over the top surface of the germanium-containing material portion 16. If the germanium-containing material portion 16 is single crystalline, the silicon capping layer may be formed by selective epitaxy, and may include single crystalline silicon that is epitaxially aligned to the single crystalline germanium-containing material of the germanium-containing material portion. In this embodiment, the periphery of the bottom surface of the capping material layer 18 (which may be a silicon capping layer) may contact a top surface of the silicon oxide layer 20, and may be laterally offset from a periphery of the top surface of the germanium-containing material portion 16 by a uniform lateral offset distance that is on the order of the thickness of the capping material layer 18 (i.e., a silicon capping layer). The thickness of the capping material layer 18 (i.e., a silicon capping layer) may be in a range from 5 nm to 200 nm, such as from 10 nm to 100 nm, although lesser and greater thicknesses may also be used. The ratio of the thickness of the germanium-containing material portion 16 to the thickness of the capping material layer 18 may be in a range from 5 to 100, such as from 10 to 50, although lesser and greater ratios may also be employed.

In an alternative embodiment, the capping material layer 18 may include a silicon capping layer that is formed by non-selective deposition of a silicon layer over the top surface of the germanium-containing material portion 16, and by subsequent patterning of the silicon layer. The silicon layer may be patterned to cover the entirety of the top surface of the germanium-containing material portion 16. In one embodiment, the periphery of the bottom surface of the capping material layer 18 (which may be a silicon capping layer) may contact a top surface of the silicon oxide layer 20, and may be laterally offset from a periphery of the top surface of the germanium-containing material portion 16 by a uniform or non-uniform lateral offset distance. The silicon capping layer (comprising the capping material layer 18) may be single crystalline, polycrystalline, or amorphous, and the thickness of the capping material layer 18 (i.e., a silicon capping layer) may be in a range from 5 nm to 200 nm, such as from 10 nm to 100 nm, although lesser and greater thicknesses may also be used.

Figure 1E:
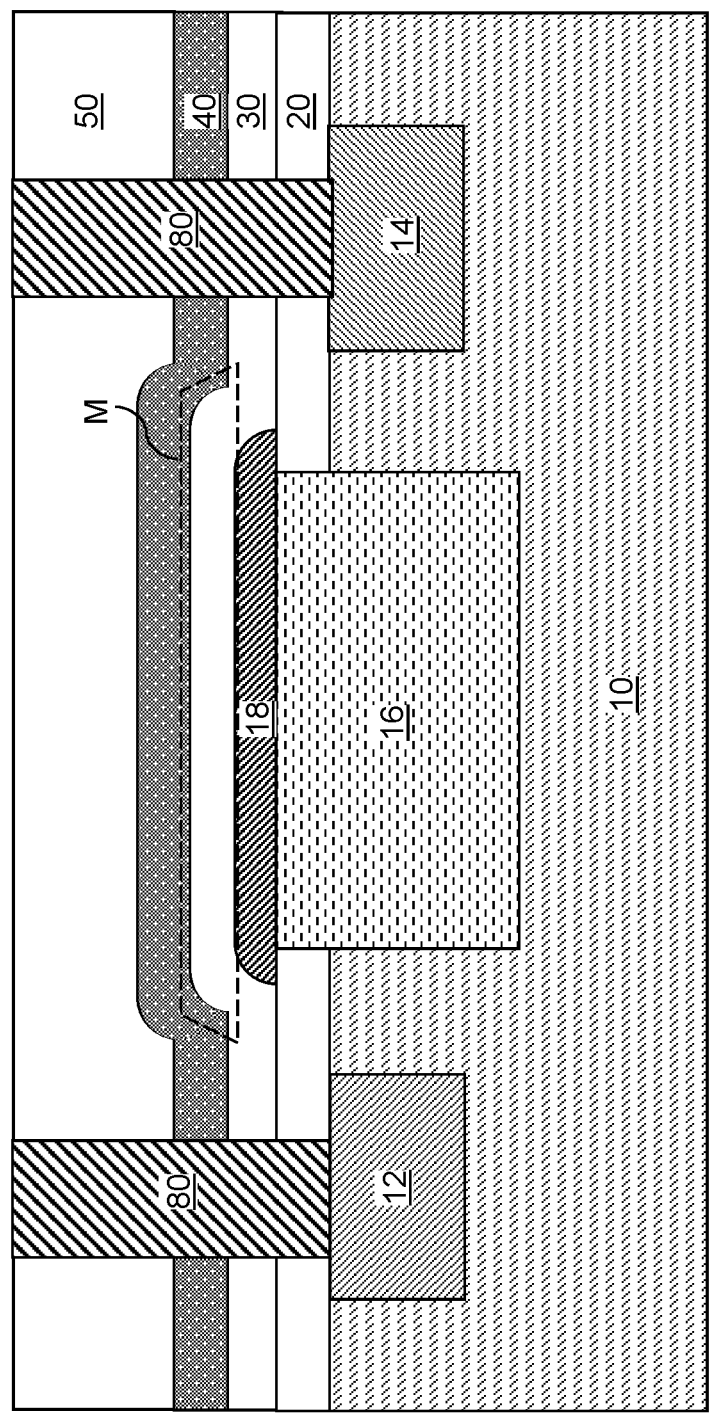

Referring to FIG. 1E, a first dielectric material layer 30 may be deposited over the silicon oxide layer 20 and the capping material layer 18. The first dielectric material layer 30 includes a mesa region M that is raised from the germanium-containing material portion 16 by the thickness of the capping material layer 18. The first dielectric material layer 30 includes a dielectric material such as undoped silicate glass, a doped silicate glass, or organosilicate glass. The thickness of the first dielectric material layer 30 may be in a range from 10 nm to 100 nm, although lesser and greater thicknesses may also be used.

A second dielectric material layer 40 may be deposited over the first dielectric material layer 30. The second dielectric material layer 40 may include a dielectric material that is different from the dielectric material of the first dielectric material layer 30. For example, the second dielectric material layer 40 may include silicon nitride. The thickness of the second dielectric material layer 40 may be in a range from 10 nm to 100 nm, although lesser and greater thicknesses may also be used.

A third dielectric material layer 50 may be deposited over the second dielectric material layer 40. The third dielectric material layer 50 may include an interconnect-level dielectric (ILD) material such as undoped silicate glass, a doped silicate glass, or organosilicate glass. The thickness of the third dielectric material layer 50 may be in a range from 200 nm to 1,000 nm, although lesser and greater thicknesses may also be used.

Various contact via structures 80 may be formed through the third dielectric material layer 50 directly on a top surface of a respective one of the at least one doped silicon region (12, 14). Optionally, the top surface of the third dielectric material layer 50 may be planarized.

Figure 1F:
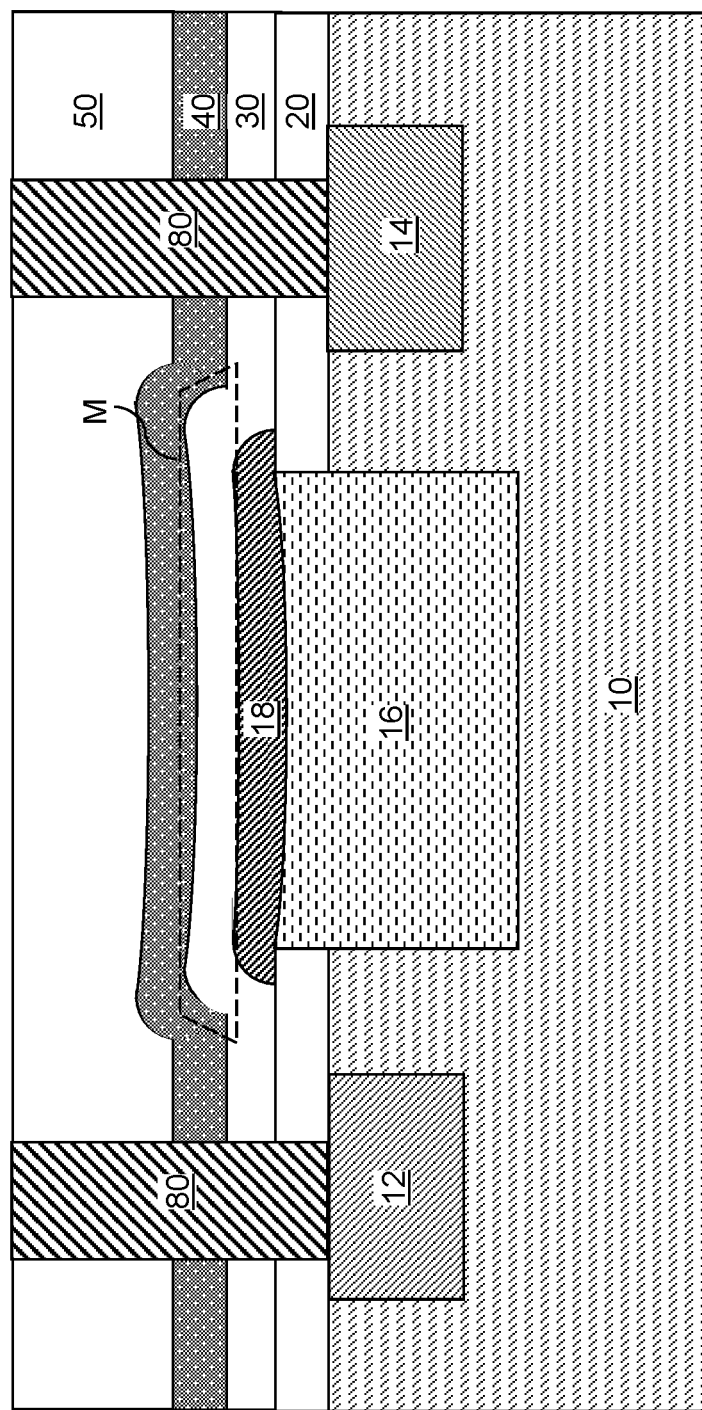
FIGS. 1F-1I are alternative configurations of the first exemplary structure according to the first embodiment of the present disclosure.

FIG. 1F illustrates a first alternative configuration of the first exemplary structure, in which a top surface of the germanium-containing material portion 16 is a concave surface. Such a concave surface may be formed during chemical mechanical polishing of the germanium-containing material in embodiments in which the lateral dimension of the germanium-containing material portion 16 is significantly greater than a lateral dimension of the germanium-containing material portion 16, which may be, for example, about 0.7 microns.

Figure 1G:
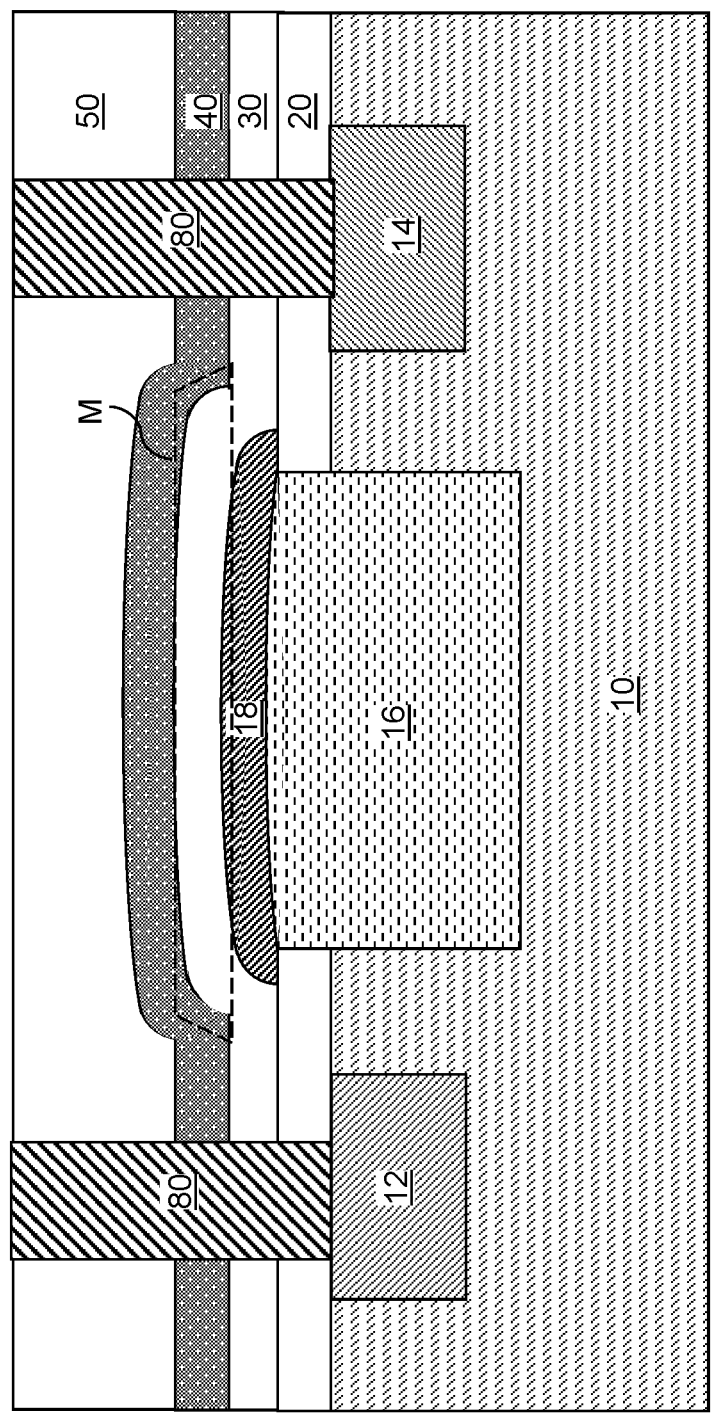

FIG. 1G illustrates a second alternative configuration of the first exemplary structure, in which a top surface of the germanium-containing material portion 16 is a convex surface. Such a convex surface may be formed during chemical mechanical polishing of the germanium-containing material in embodiments in which the lateral dimension of the germanium-containing material portion 16 is significantly less than a lateral dimension of the germanium-containing material portion 16, which may be, for example, about 0.7 microns.

Figure 1H:
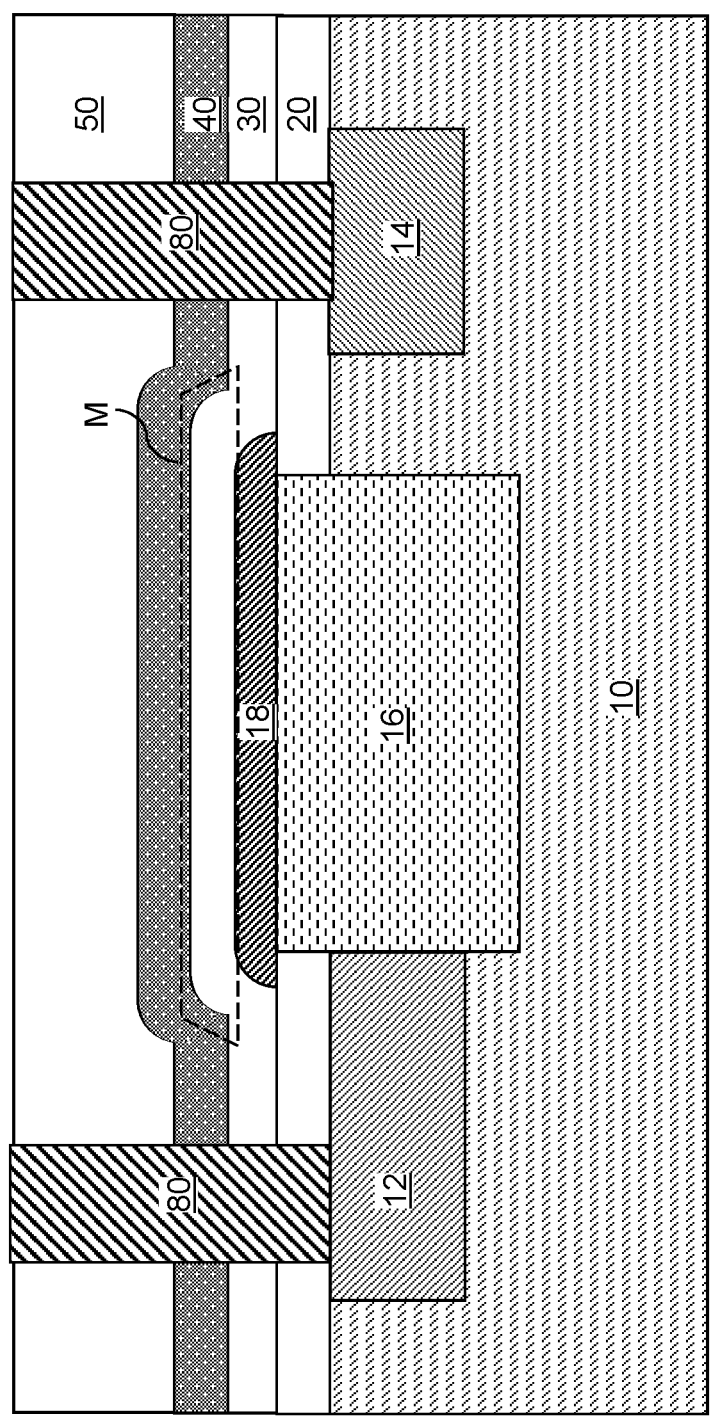

FIG. 1H illustrates a third alternative configuration of the first exemplary structure, in which a first doped silicon portion 12 having a doping of the first conductivity type contacts a sidewall of the germanium-containing material portion 16. The third alternative configuration of the first exemplary structure may be derived from any of the previously described configurations of the first exemplary structure by providing direct contact between the first doped silicon portion 12 and the germanium-containing material portion 16. The germanium-containing material portion 16 may be intrinsic, p-doped, or n-doped, and a p-n junction, a p-i junction, or an n-i junction may, or may not, be present at an interface between the first doped silicon portion 12 and the germanium-containing material portion 16.

Figure 1I:
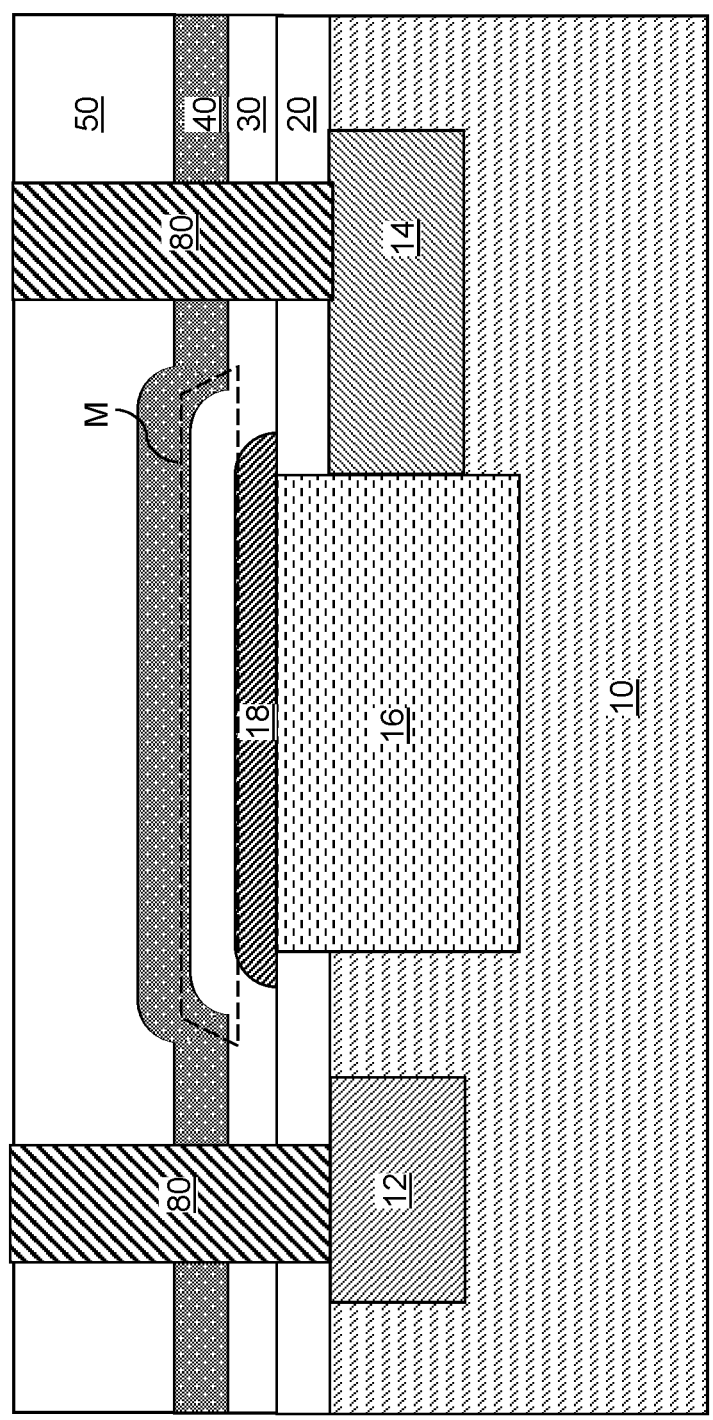

FIG. 1I illustrates a fourth alternative configuration of the first exemplary structure, in which a second doped silicon portion 14 having a doping of the second conductivity type contacts a sidewall of the germanium-containing material portion 16. The fourth alternative configuration of the first exemplary structure may be derived from any of the previously described configurations of the first exemplary structure by providing direct contact between the second doped silicon portion 14 and the germanium-containing material portion 16. The germanium-containing material portion 16 may be intrinsic, p-doped, or n-doped, and a p-n junction, a p-i junction, or an n-i junction may, or may not, be present at an interface between the second doped silicon portion 14 and the germanium-containing material portion 16.

Referring to all configurations of the first exemplary structure and according to various embodiments of the present disclosure, a semiconductor device is provided, which comprises a semiconductor substrate including a silicon layer 10 and a germanium-containing material portion 16 laterally surrounded by the silicon layer 10; a silicon oxide layer 20 overlying the semiconductor substrate, wherein the germanium-containing material portion 16 is laterally surrounded by the silicon oxide layer 20; a silicon capping layer (comprising the capping material layer 18) contacting a top surface of the germanium-containing material portion 16; and a first dielectric material layer 30 overlying the silicon oxide layer 20 and the silicon capping layer and including a mesa region M that is raised from the germanium-containing material portion 16 by a thickness of the silicon capping layer. Generally, at least one doped silicon region (12, 14) may be embedded in the silicon layer 10, and the semiconductor device may comprise a p-n junction or a p-i-n junction located between one of the at least one doped silicon region (12, 14) and the germanium-containing material portion 16.

Figure 2A:
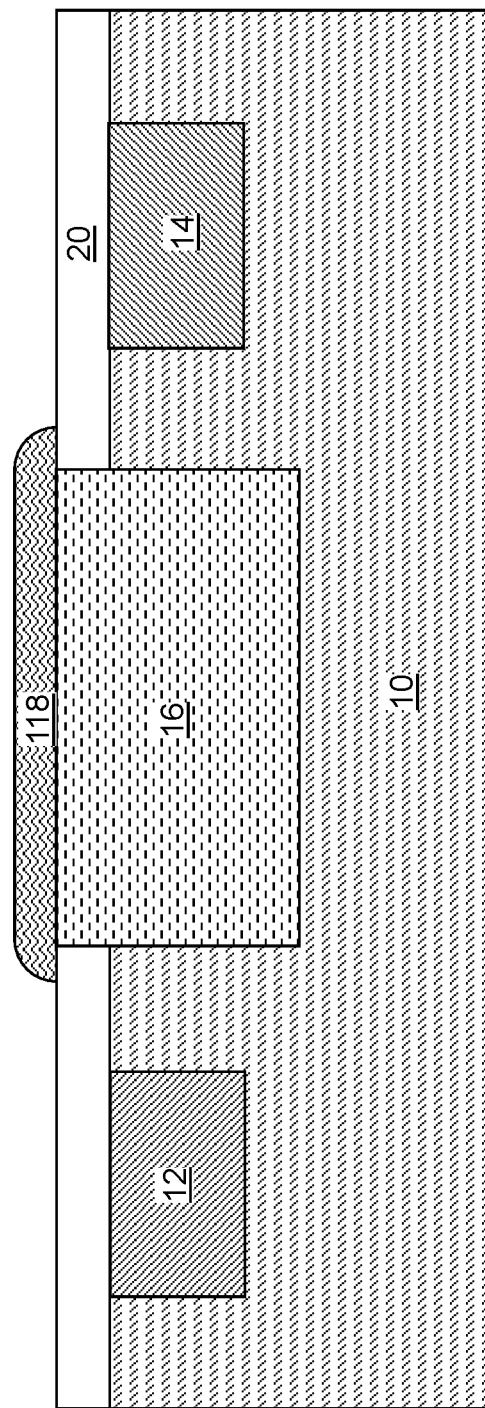
FIGS. 2A-2E are sequential vertical cross-sectional views for a second exemplary structure according to a second embodiment of the present disclosure.

FIGS. 2A-2E are sequential vertical cross-sectional views for a second exemplary structure according to a second embodiment of the present disclosure. Referring to FIG. 2A, the second exemplary structure according to the second embodiment of the present disclosure may be derived from the first exemplary structure illustrated in FIG. 1C by forming a capping material layer 118 that includes a sacrificial material that may be subsequently removed selective to the materials of the germanium-containing material portion 16 and the silicon oxide layer 20. For example, the capping material layer 118 may include, and/or may consist essentially of, silicon (such as amorphous silicon, polysilicon, or single crystalline silicon), carbon (such as amorphous carbon or diamond-like carbon (DLC)), a polymer material (such as a silicon-based polymer material), porous organosilicate glass, borosilicate glass, silicon nitride, or a dielectric metal oxide material (such as amorphous aluminum oxide). In one embodiment, the capping material layer 118 may be free of germanium.

The material of the capping material layer 118 may be deposited by a conformal or a non-conformal deposition process as a blanket material layer (i.e., as an unpatterned material layer), and may be subsequently patterned to cover the entirety of the top surface of the germanium-containing material portion 16 and a peripheral area of the silicon oxide layer 20 that is proximal to the germanium-containing material portion 16. In one embodiment, the capping material layer 118 has a uniform thickness, and covers the entirety of the top surface of the germanium-containing material portion 16. The thickness of the capping material layer 118 may be in a range from 5 nm to 200 nm, such as from 10 nm to 100 nm, although lesser and greater thicknesses may also be used. The ratio of the thickness of the germanium-containing material portion 16 to the thickness of the capping material layer 18 may be in a range from 5 to 100, such as from 10 to 50, although lesser and greater ratios may also be employed.

In one embodiment, the silicon layer 10 comprises a single crystalline silicon material. In one embodiment, the germanium-containing material portion 16 comprises a single crystalline silicon-germanium alloy or a single crystalline germanium material portion, and is epitaxially aligned to the single crystalline silicon material of the silicon layer 10. In one embodiment, a top periphery of the germanium-containing material portion 16 coincides with a closed periphery of a top surface of the silicon oxide layer 20.

Figure 2B:
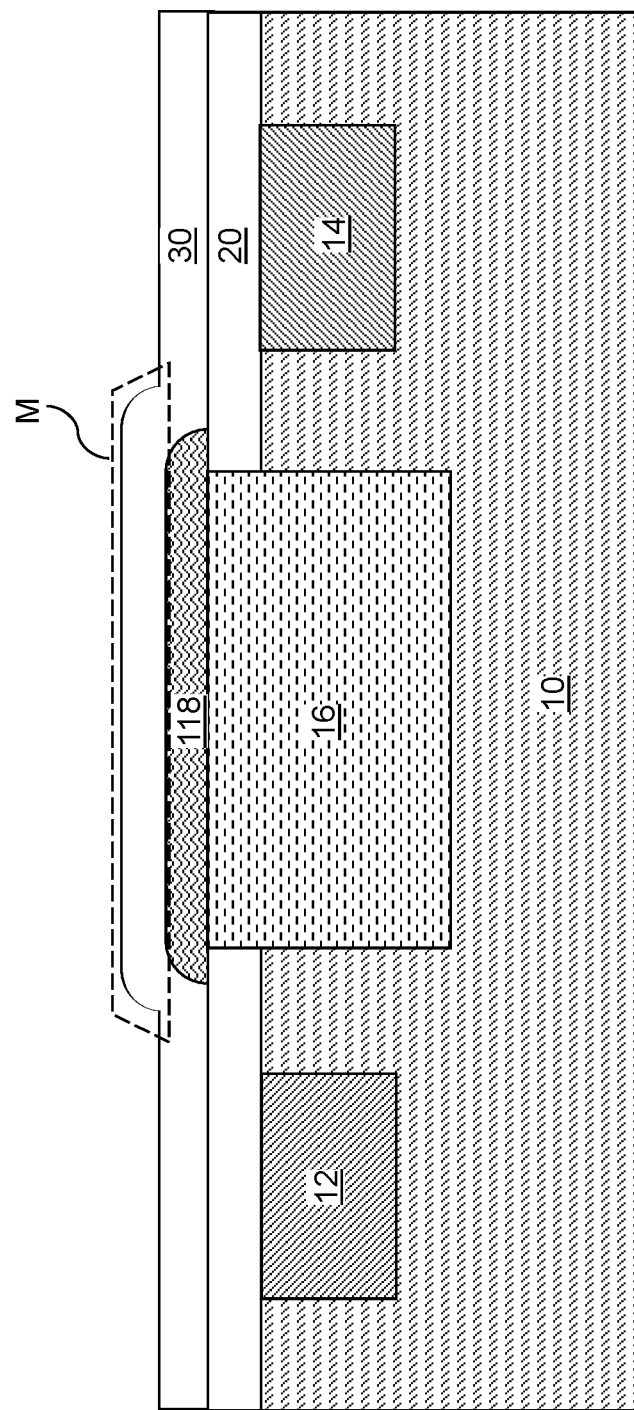

Referring to FIG. 2B, a first dielectric material layer 30 may be formed over the silicon oxide layer 20 and the capping material layer 118. The first dielectric material layer 30 includes a different material than the sacrificial material of the capping material layer 118. The first dielectric material layer 30 includes a mesa region M that is raised from the germanium-containing material portion 16 by the thickness of the capping material layer 118. The first dielectric material layer 30 includes a dielectric material such as undoped silicate glass or a doped silicate glass. The thickness of the first dielectric material layer 30 may be in a range from 10 nm to 100 nm, although lesser and greater thicknesses may also be used.

Figure 2C:
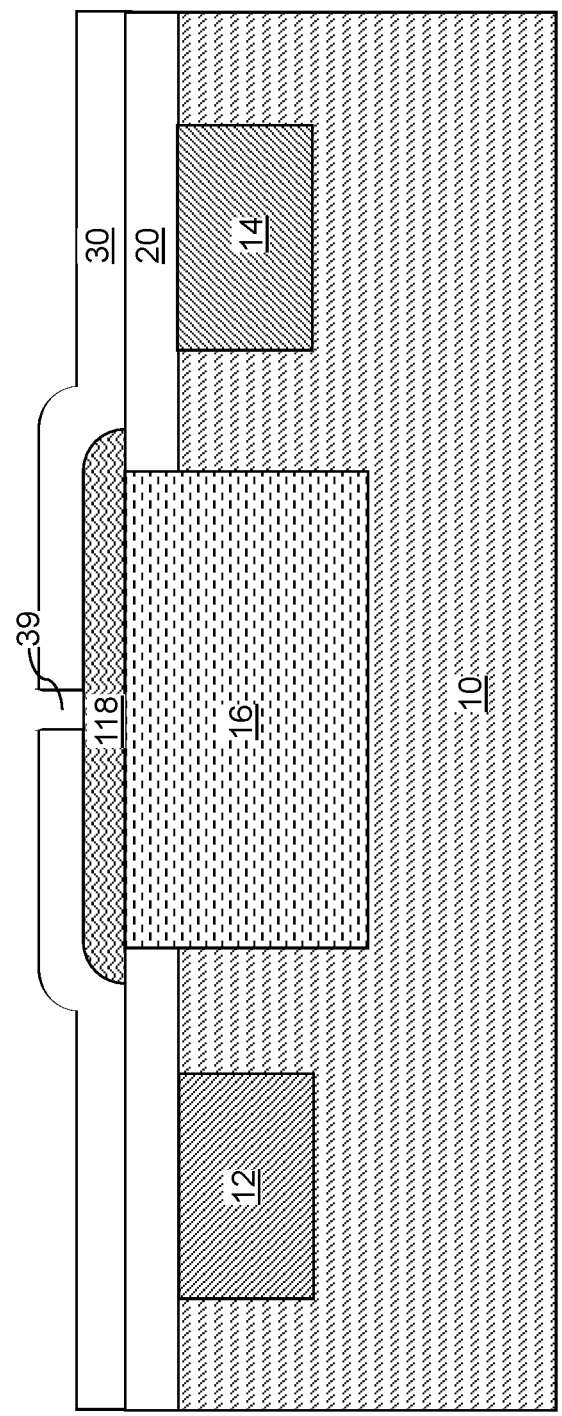

Referring to FIG. 2C, at least one via cavity 39 may be formed through the first dielectric material layer 30. For example, a photoresist layer (not shown) may be applied over the first dielectric material layer 30, and may be lithographically patterned to form at least one opening within an area that overlies the capping material layer 118. An anisotropic etch process may be performed to transfer the pattern in the photoresist layer through the first dielectric material layer 30. The photoresist layer is subsequently removed, for example, by ashing. The lateral dimension (such as a diameter) of each via cavity 39 may be in a range from 10 nm to 50 nm, although lesser and greater lateral dimensions may also be used.

Figure 2D:
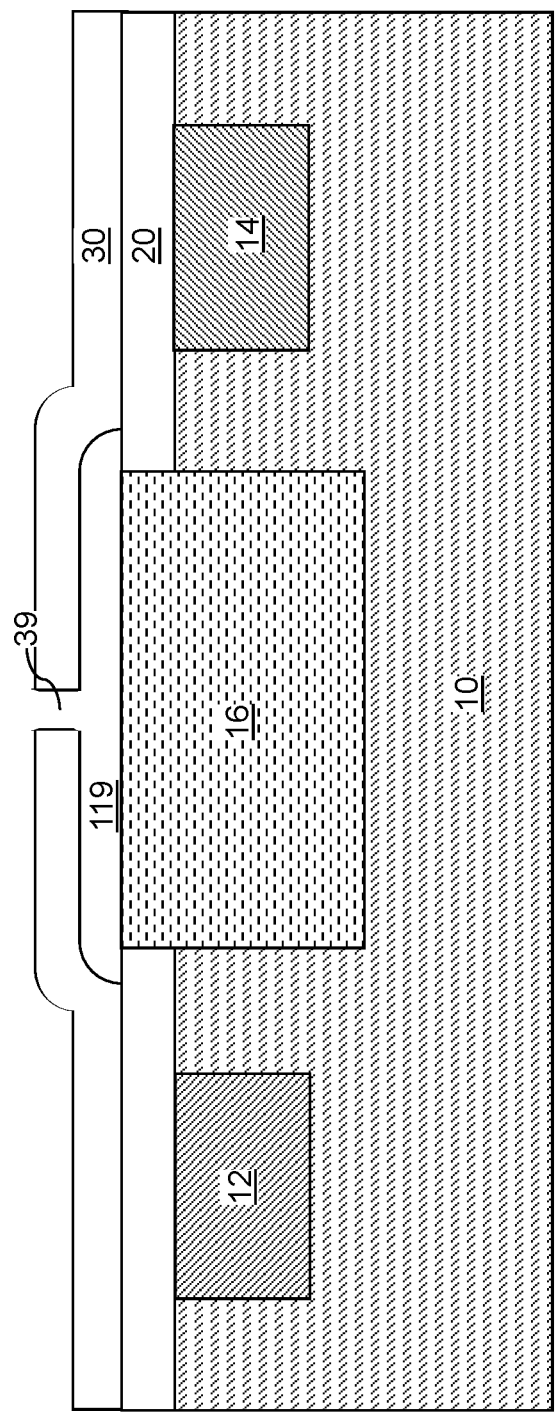
Figure 2E:
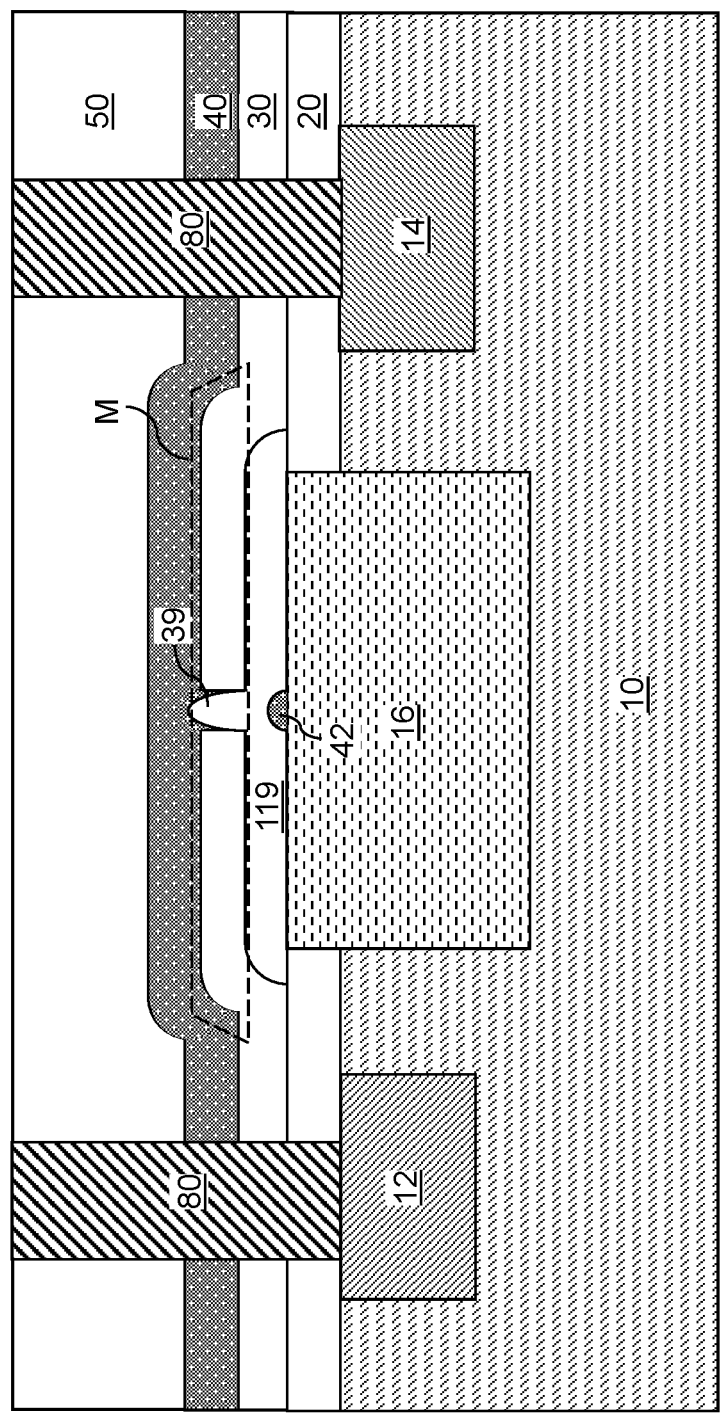

Referring to FIG. 2D, a cavity 119 may be formed by removing the sacrificial material of the capping material layer 118 selective to the materials of the germanium-containing material portion 16, the silicon oxide layer 20, and the first dielectric material layer 30. The removal of the sacrificial material of the capping material layer 118 may be effected, for example, by an isotropic etch process that etches the sacrificial material selective to the materials of the germanium-containing material portion 16, the silicon oxide layer 20, and the first dielectric material layer 30. The isotropic etch process may use a wet etch process or a chemical dry etch (CDE) process. In an illustrative example, if the capping material layer 118 includes porous organosilicate glass, a wet etch process using dilute hydrofluoric acid may be used. If the capping material layer 118 includes silicon nitride, a wet etch process using hot phosphoric acid may be used. In embodiments in which the capping material layer 118 include amorphous carbon or diamond-like carbon, an ashing process may be used in lieu of an isotropic etch process. The cavity 119 includes a volume from which the capping material layer 118 is removed. The cavity 119 comprises a laterally-extending cavity overlying the entire area of the top surface of the germanium-containing material portion 16 and peripheral areas of the silicon oxide layer 20 that are proximal to the germanium-containing material portion 16.

A second dielectric material layer 40 may be deposited by a non-conformal deposition process such as a plasma-enhanced chemical vapor deposition (PECVD) process or a physical vapor deposition (PVD) process. The second dielectric material layer 40 includes a dielectric material such as silicon nitride, silicon oxide, or a dielectric metal oxide. The anisotropic deposition process used to deposit the second dielectric material layer 40 deposits the dielectric material on each sidewall of the at least one via cavity 39 such that each via cavity 39 is sealed with the second dielectric material layer 40. Generally, the at least one via cavity 39 may be sealed by anisotropically depositing the second dielectric material layer 40. The top portion of each of the at least one via cavity 39 may be sealed by the second dielectric material layer 40. The cavity 119 becomes an encapsulated cavity that is encapsulated by the germanium-containing material portion 16, the silicon oxide layer 20, the first dielectric material layer 30, and the second dielectric material layer 40. The cavity 119 includes a laterally-extending portion that overlies the germanium-containing material portion 16 and at least one vertically-protruding portion including an unfilled volume of the respective via cavity 39.

A downward-protruding portion of the second dielectric material layer 40 may contact a sidewall of a respective one of the at least one via cavity 39. Portions of the dielectric material of the second dielectric material layer 40 that pass through the at least one via cavity 39 may be deposited at the bottom of the cavity 119 to form at least one discrete dielectric material portion 42 surrounded by the encapsulated cavity 119. Each discrete dielectric material portion 42 may have the same material composition as the second dielectric material layer 40, and may underlie a respective one of the at least one via cavity 39. Each discrete dielectric material portion 42 may contact a top surface of the silicon oxide layer 20 and/or a top surface of the germanium-containing material portion 16. In one embodiment, the laterally-extending portion of the encapsulated cavity 119 may have a uniform height between the top surface of the germanium-containing material portion 16 and a bottom surface of the mesa region M of the first dielectric material layer 30.

A third dielectric material layer 50 may be deposited over the second dielectric material layer 40. The third dielectric material layer 50 may include an interconnect-level dielectric (ILD) material such as undoped silicate glass, a doped silicate glass, or organosilicate glass. The thickness of the third dielectric material layer 50 may be in a range from 200 nm to 1,000 nm, although lesser and greater thicknesses may also be used.

Various contact via structures 80 may be formed through the third dielectric material layer 50 directly on a top surface of a respective one of the at least one doped silicon region (12, 14). Optionally, the top surface of the third dielectric material layer 50 may be planarized.

Figure 2F:
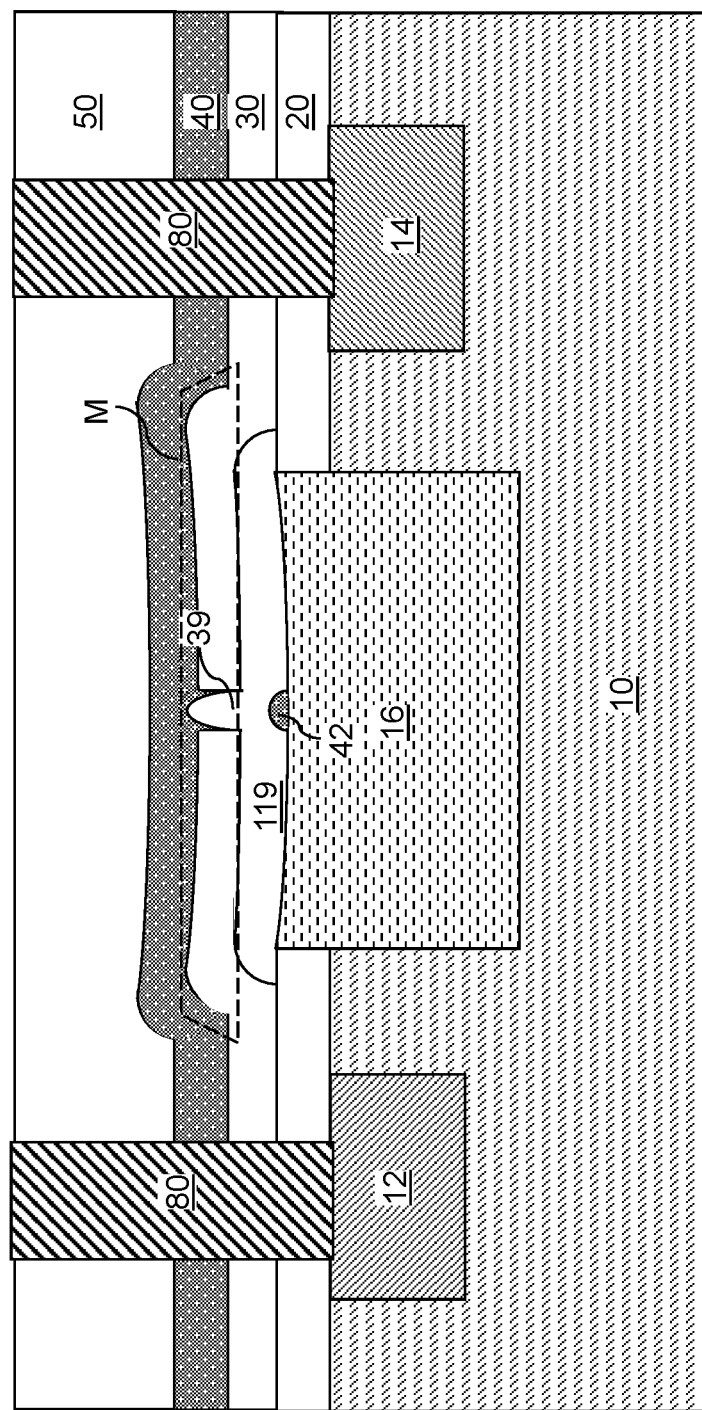
FIGS. 2F-2J are alternative configurations of the second exemplary structure according to the second embodiment of the present disclosure.

FIG. 2F illustrates a first alternative configuration of the second exemplary structure, in which a top surface of the germanium-containing material portion 16 is a concave surface. Such a concave surface may be formed during chemical mechanical polishing of the germanium-containing material in embodiments in which the lateral dimension of the germanium-containing material portion 16 is significantly greater than a lateral dimension, which may be, for example, about 0.7 microns.

Figure 2G:
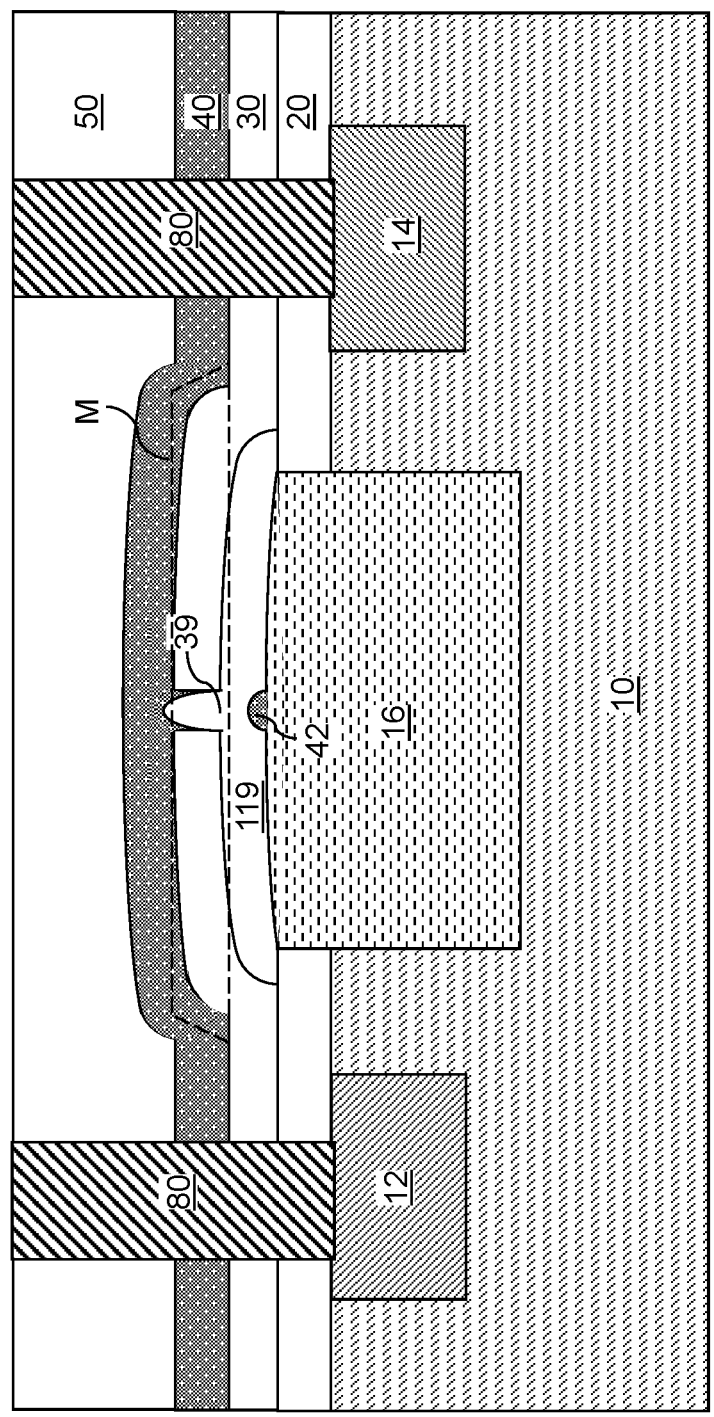

FIG. 2G illustrates a second alternative configuration of the second exemplary structure, in which a top surface of the germanium-containing material portion 16 is a convex surface. Such a convex surface may be formed during chemical mechanical polishing of the germanium-containing material in embodiments in which the lateral dimension of the germanium-containing material portion 16 is significantly less than a lateral dimension, which may be, for example, about 0.7 microns.

Figure 2H:
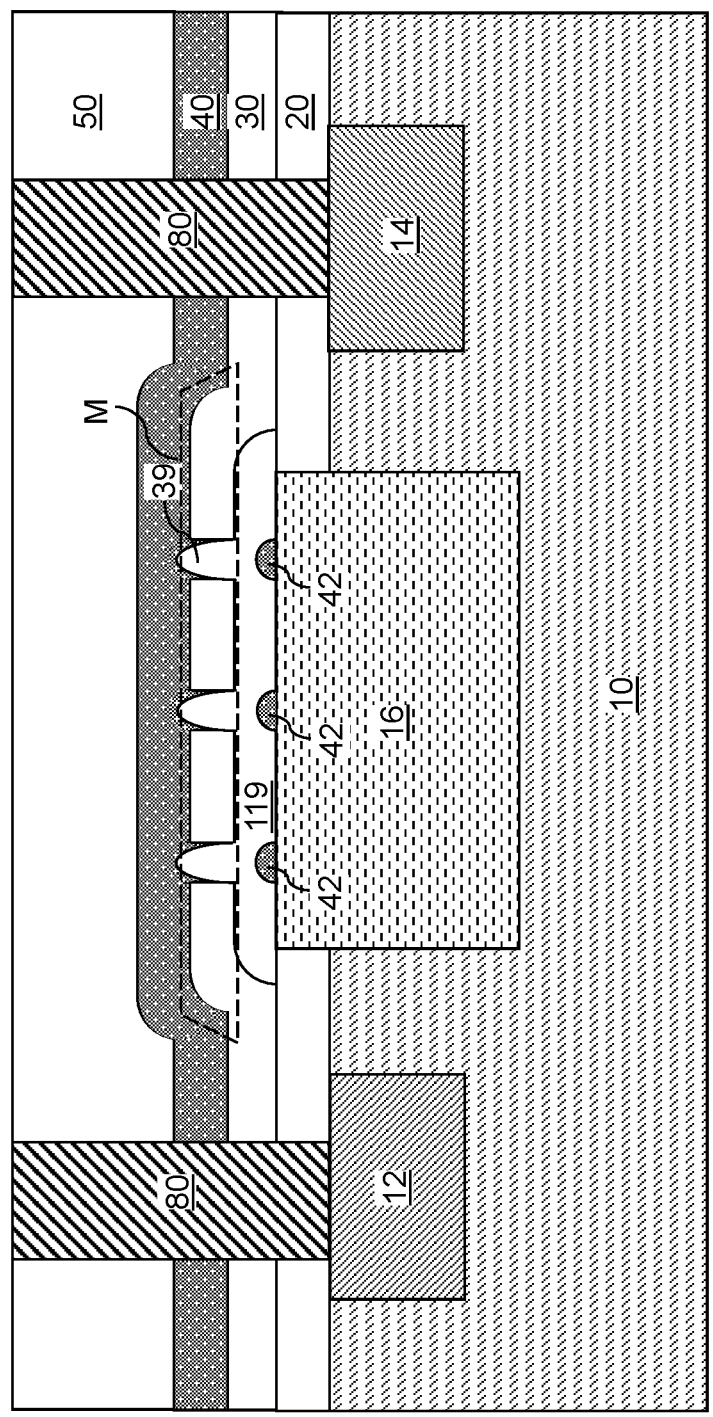

FIG. 2H illustrates a third alternative configuration of the second exemplary structure, in which a plurality of via cavities 39 may be formed through the first dielectric material layer 30. The third alternative configuration of the first exemplary structure may be derived from any of the previously described configurations of the second exemplary structure by forming a plurality of via cavities 39 through the first dielectric material layer 30. The plurality of via cavities 39 may function as the conduit for introducing an isotropic etchant for removing the sacrificial material of the capping material layer 118. A plurality of discrete dielectric material portions 42 may be formed underneath the plurality of via cavities 39. The encapsulated cavity 119 may include a laterally-extending portion and a plurality of vertically-protruding via cavity portions.

Figure 2I:
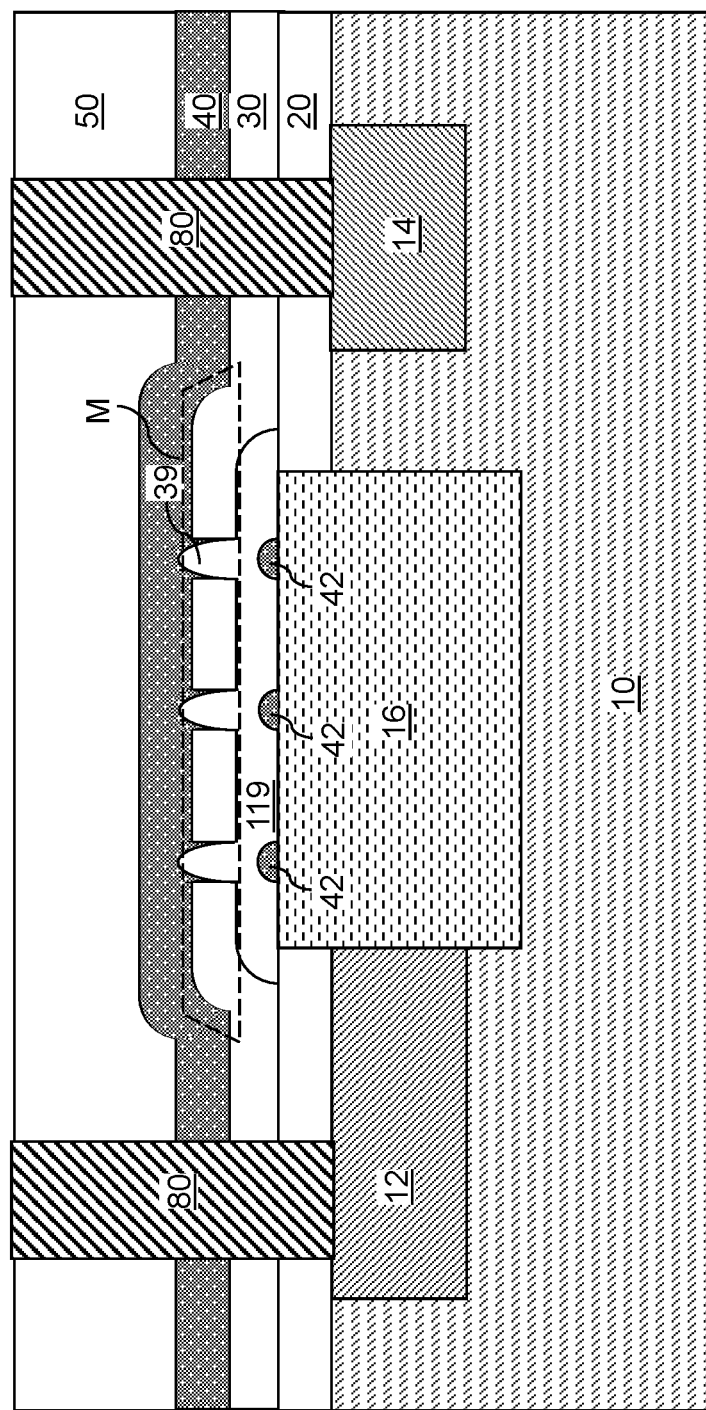

FIG. 2I illustrates a fourth alternative configuration of the second exemplary structure, in which a first doped silicon portion 12 having a doping of the first conductivity type contacts a sidewall of the germanium-containing material portion 16. The fourth alternative configuration of the second exemplary structure may be derived from any of the previously described configurations of the second exemplary structure by providing direct contact between the first doped silicon portion 12 and the germanium-containing material portion 16. The germanium-containing material portion 16 may be intrinsic, p-doped, or n-doped, and a p-n junction, a p-i junction, or an n-i junction may, or may not, be present at an interface between the first doped silicon portion 12 and the germanium-containing material portion 16.

Figure 2J:
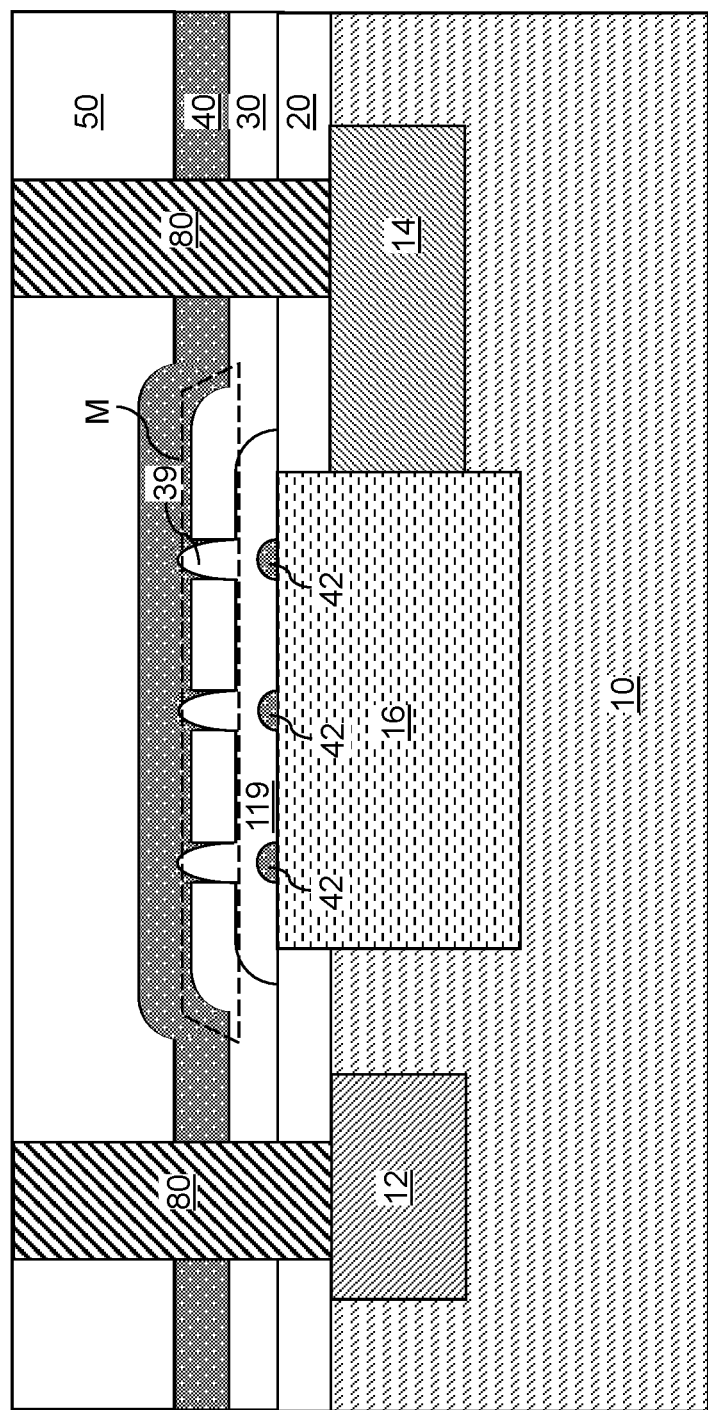

FIG. 2J illustrates a fifth alternative configuration of the second exemplary structure, in which a second doped silicon portion 14 having a doping of the second conductivity type contacts a sidewall of the germanium-containing material portion 16. The fifth alternative configuration of the second exemplary structure may be derived from any of the previously described configurations of the second exemplary structure by providing direct contact between the second doped silicon portion 14 and the germanium-containing material portion 16. The germanium-containing material portion 16 may be intrinsic, p-doped, or n-doped, and a p-n junction, a p-i junction, or an n-i junction may, or may not, be present at an interface between the second doped silicon portion 14 and the germanium-containing material portion 16.

Figure 3A:
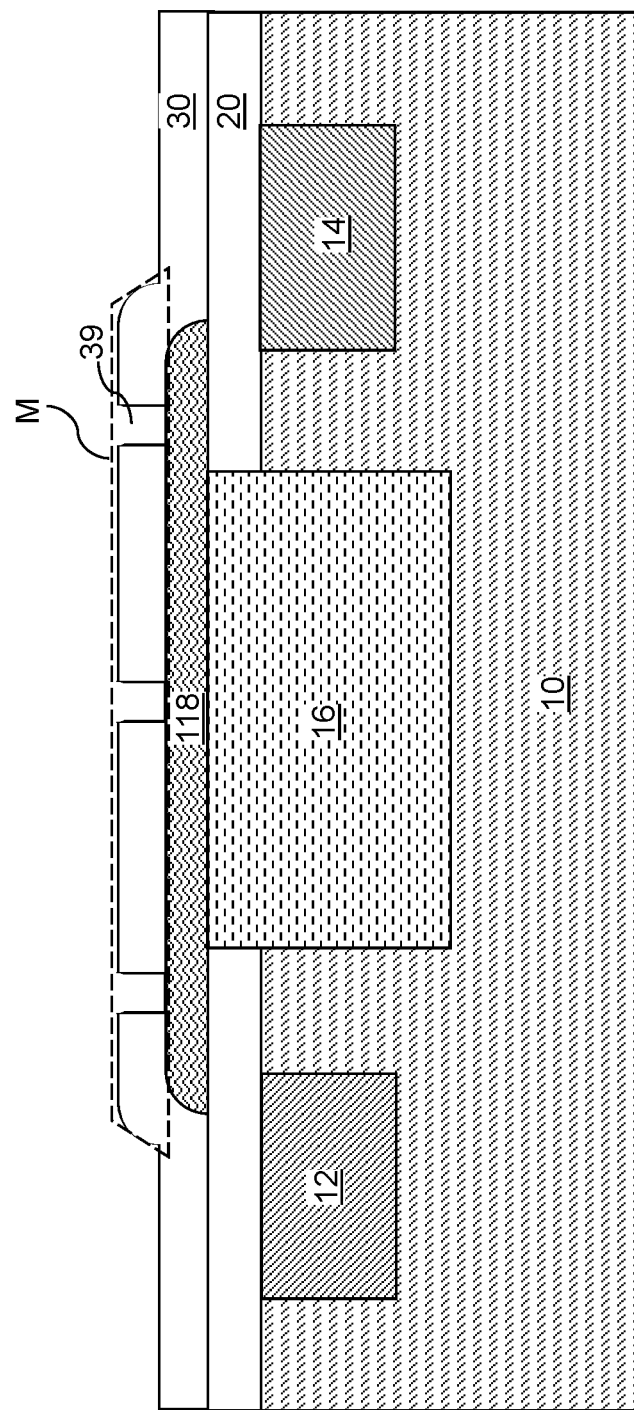
FIGS. 3A-3B are sequential vertical cross-sectional views for a third exemplary structure according to a third embodiment of the present disclosure.
Figure 3B:
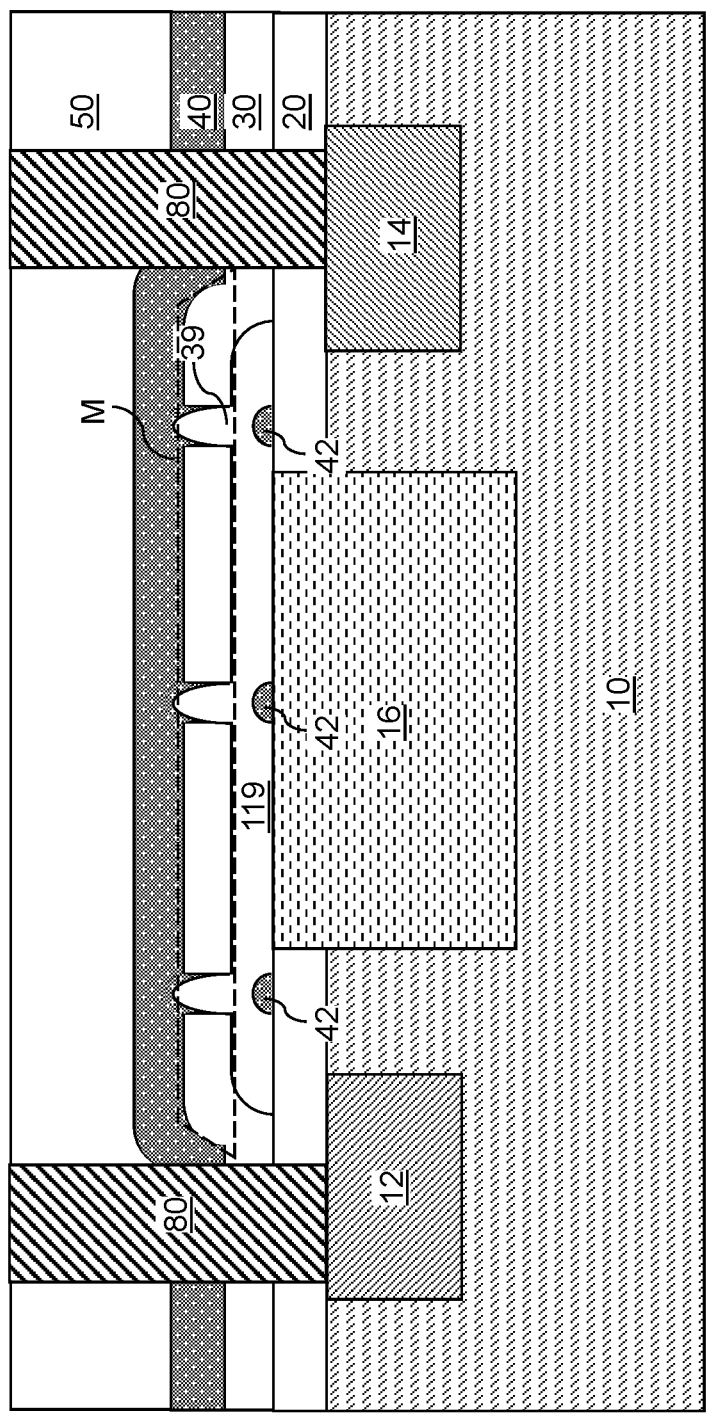

FIGS. 3A-3B are sequential vertical cross-sectional views for a third exemplary structure according to a third embodiment of the present disclosure. Referring to FIG. 3A, the third exemplary structure may be derived from any configuration of the second exemplary structure by laterally extending the capping material layer 118 from a top periphery of the germanium-containing material portion 16 by an extension distance that is greater than the thickness of the capping material layer 118. In one embodiment, the capping material layer 118 may be formed by deposition of a sacrificial material as a blanket material layer over the germanium-containing material portion 16 and the silicon oxide layer 20, and by patterning the blanket material layer by applying and patterning a photoresist layer over the blanket material layer, and by transferring the pattern in the photoresist layer through the blanket material layer using an etch process (which may use an isotropic etch process or an anisotropic etch process).

Subsequently, a first dielectric material layer 30 may be formed over the silicon oxide layer 20 and the capping material layer 118. The first dielectric material layer 30 includes a different material than the sacrificial material of the capping material layer 118. The first dielectric material layer 30 includes a mesa region M that is raised from the germanium-containing material portion 16 by the thickness of the capping material layer 118. The first dielectric material layer 30 includes a dielectric material such as undoped silicate glass or a doped silicate glass. The thickness of the first dielectric material layer 30 may be in a range from 10 nm to 100 nm, although lesser and greater thicknesses may also be used.

At least one via cavity 39 may be formed through the first dielectric material layer 30 within the area of the germanium-containing material portion 16 and/or outside the area of the germanium-containing material portion 16. For example, a photoresist layer (not shown) may be applied over the first dielectric material layer 30, and may be lithographically patterned to form at least one opening within the area of the germanium-containing material portion 16 and/or within at least one area located entirely outside the area of the germanium-containing material portion 16. Thus, each opening in the photoresist layer may be formed within, or outside, the area of the silicon oxide layer 20. An anisotropic etch process may be performed to transfer the pattern in the photoresist layer through the first dielectric material layer 30. The photoresist layer is subsequently removed, for example, by ashing. The lateral dimension (such as a diameter) of each via cavity 39 may be in a range from 10 nm to 50 nm, although lesser and greater lateral dimensions may also be used. Each via cavity 39 may be formed entirely within the area of the silicon oxide layer 20.

Figure 3C:
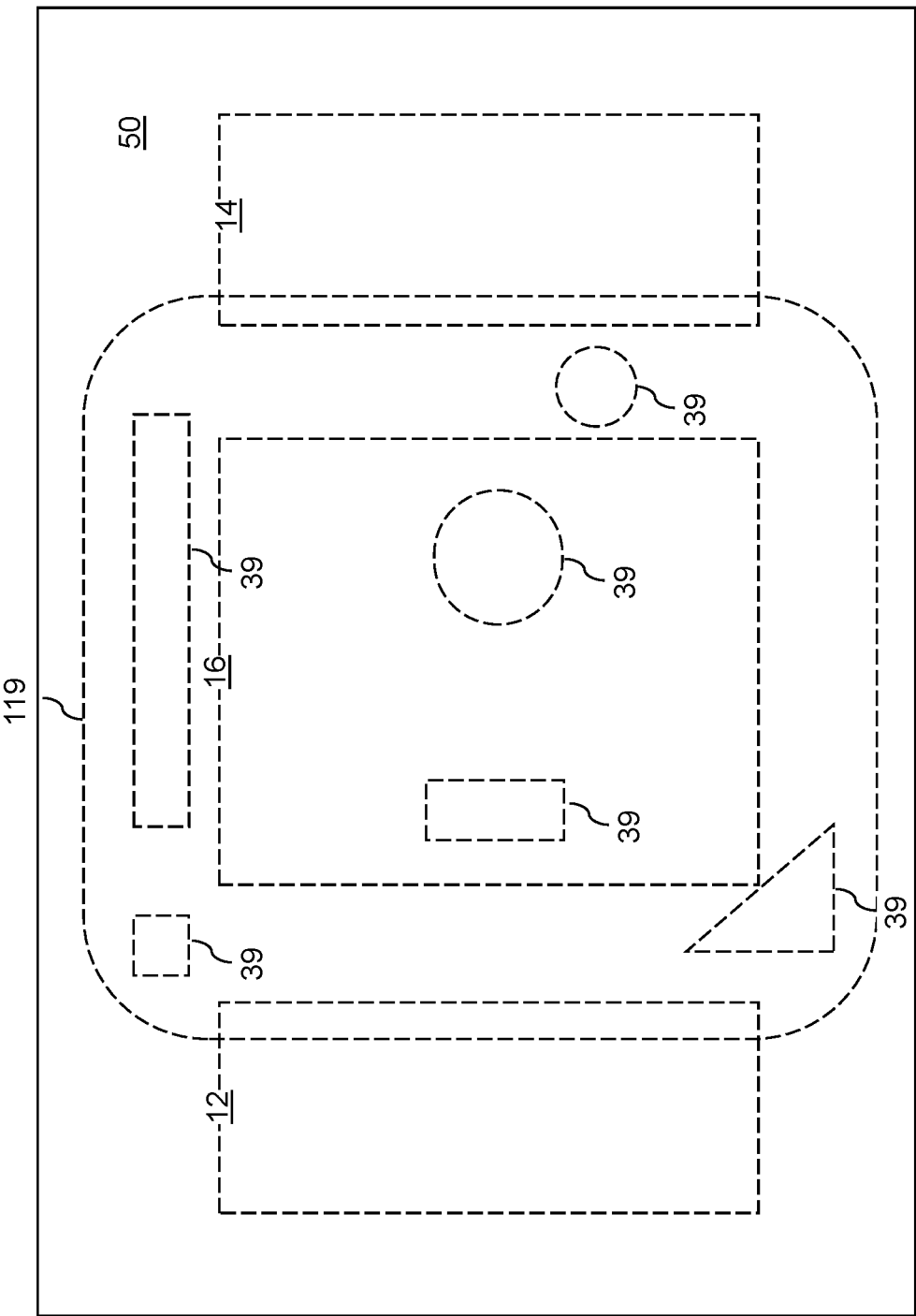
FIG. 3C is a plan view of the third exemplary structure of FIG. 3B.

FIG. 3C is a plan view of the third exemplary structure at the processing steps of FIG. 3B. Referring to FIGS. 3B and 3C, a cavity 119 may be formed by removing the sacrificial material of the capping material layer 118 selective to the materials of the germanium-containing material portion 16, the silicon oxide layer 20, and the first dielectric material layer 30. The removal of the sacrificial material of the capping material layer 118 may be effected, for example, by an isotropic etch process that etches the sacrificial material selective to the materials of the germanium-containing material portion 16, the silicon oxide layer 20, and the first dielectric material layer 30. The isotropic etch process may use a wet etch process or a chemical dry etch (CDE) process. The cavity 119 includes a volume from which the capping material layer 118 is removed. The cavity 119 comprises a laterally-extending cavity overlying the entire area of the top surface of the germanium-containing material portion 16 and peripheral areas of the silicon oxide layer 20 that are proximal to the germanium-containing material portion 16. Via cavities 39 overlying the area of the germanium-containing material portion 16 and/or the area of the silicon oxide layer 20 connects the cavity 119 to the ambient located above the first dielectric material layer 30.

A second dielectric material layer 40 may be deposited by a non-conformal deposition process such as a plasma-enhanced chemical vapor deposition (PECVD) process or a physical vapor deposition (PVD) process. The second dielectric material layer 40 includes a dielectric material such as silicon nitride, silicon oxide, or a dielectric metal oxide. The anisotropic deposition process used to deposit the second dielectric material layer 40 deposits the dielectric material on each sidewall of the at least one via cavity 39 such that each via cavity 39 is sealed with the second dielectric material layer 40. Generally, the at least one via cavity 39 may be sealed by anisotropically depositing the second dielectric material layer 40. The top portion of each of the at least one via cavity 39 may be sealed by the second dielectric material layer 40. The cavity 119 becomes an encapsulated cavity that is encapsulated by the germanium-containing material portion 16, the silicon oxide layer 20, the first dielectric material layer 30, and the second dielectric material layer 40. The cavity 119 includes a laterally-extending portion that overlies the germanium-containing material portion 16 and at least one vertically-protruding portion including an unfilled volume of the respective via cavity 39.

A downward-protruding portion of the second dielectric material layer 40 may contact a sidewall of a respective one of the at least one via cavity 39. Portions of the dielectric material of the second dielectric material layer 40 that pass through the at least one via cavity 39 may be deposited at the bottom of the cavity 119 to form at least one discrete dielectric material portion 42 surrounded by the encapsulated cavity 119. Each discrete dielectric material portion 42 may have the same material composition as the second dielectric material layer 40, and may underlie a respective one of the at least one via cavity 39. Each discrete dielectric material portion 42 may contact a top surface of the silicon oxide layer 20 and/or a top surface of the germanium-containing material portion 16. In one embodiment, the laterally-extending portion of the encapsulated cavity 119 may have a uniform height between the top surface of the germanium-containing material portion 16 and a bottom surface of the mesa region M of the first dielectric material layer 30.

A third dielectric material layer 50 may be deposited over the second dielectric material layer 40. The third dielectric material layer 50 may include an interconnect-level dielectric (ILD) material such as undoped silicate glass, a doped silicate glass, or organosilicate glass. The thickness of the third dielectric material layer 50 may be in a range from 200 nm to 1,000 nm, although lesser and greater thicknesses may also be used.

Various contact via structures 80 may be formed through the third dielectric material layer 50 directly on a top surface of a respective one of the at least one doped silicon region (12, 14). Optionally, the top surface of the third dielectric material layer 50 may be planarized.

Figure 4A:
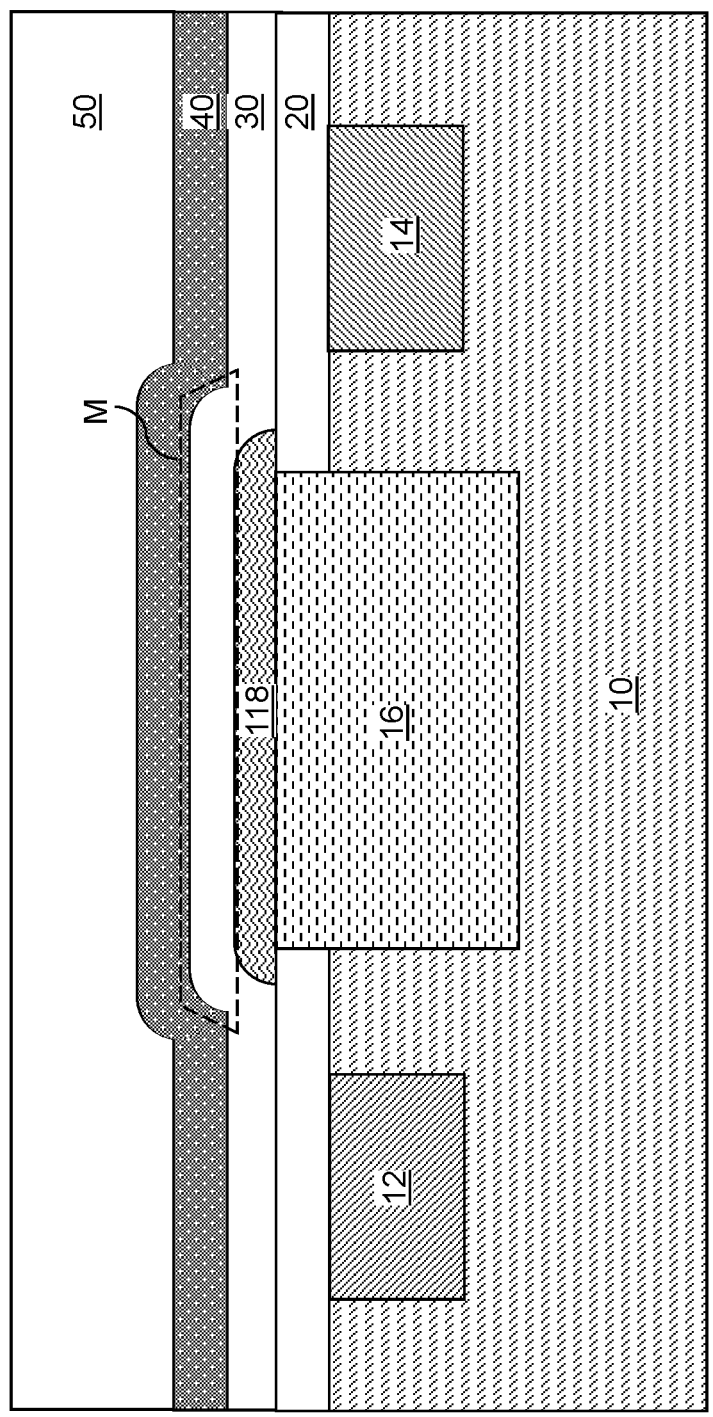
FIGS. 4A-4D are sequential vertical cross-sectional views for a fourth exemplary structure according to a fourth embodiment of the present disclosure.

FIGS. 4A-4D are sequential vertical cross-sectional views for a fourth exemplary structure according to a fourth embodiment of the present disclosure. Referring to FIG. 4A, the fourth exemplary structure may be derived from any configuration of the second exemplary structure or the third exemplary structure by omitting formation of the via cavities 39 through the first dielectric material layer 30 and by omitting removal of the capping material layer 118. The capping material layer 118 contacts the entirety of the top surface of the germanium-containing material portion 16 and the top surface of a peripheral portion of the silicon oxide layer 20 that laterally surrounds the germanium-containing material portion 16. The first dielectric material layer 30 includes a mesa region M that is raised from the germanium-containing material portion 16 by the thickness of the capping material layer 18. The first dielectric material layer 30 includes a dielectric material such as undoped silicate glass, a doped silicate glass, or organosilicate glass. The thickness of the first dielectric material layer 30 may be in a range from 10 nm to 100 nm, although lesser and greater thicknesses may also be used. The second dielectric material layer 40 and the third dielectric material layer 50 may have the same material composition and the same thickness range as in the second or third exemplary structures.

Figure 4B:
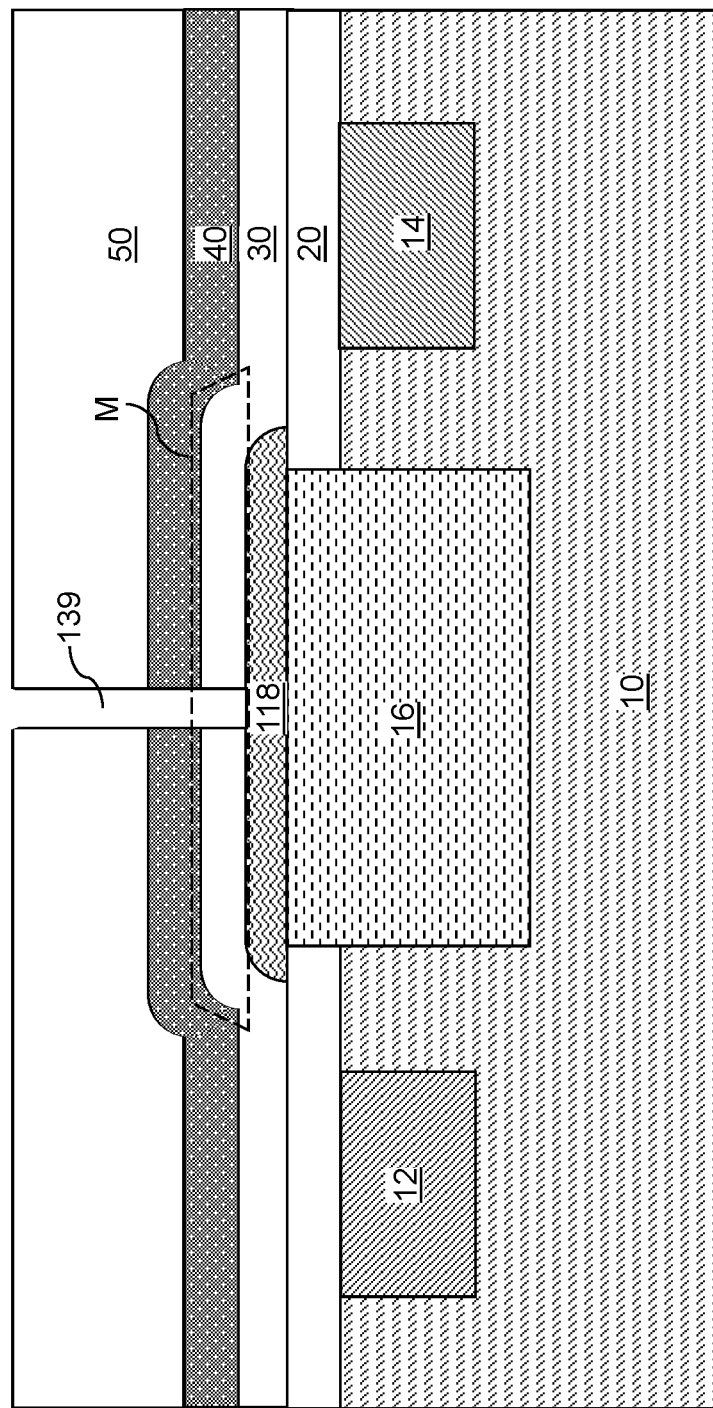

Referring to FIG. 4B, at least one via cavity 139 may be formed through the third dielectric material layer 50, the second dielectric material layer 40, and the first dielectric material layer 30. For example, a photoresist layer (not shown) may be applied over the third dielectric material layer 50, and may be lithographically patterned to form at least one opening within an area that overlies the capping material layer 118. An anisotropic etch process may be performed to transfer the pattern in the photoresist layer through the third dielectric material layer 50, the second dielectric material layer 40, and the first dielectric material layer 30. The photoresist layer is subsequently removed, for example, by ashing. The lateral dimension (such as a diameter) of each via cavity 139 may be in a range from 10 nm to 50 nm, although lesser and greater lateral dimensions may also be used.

Figure 4C:
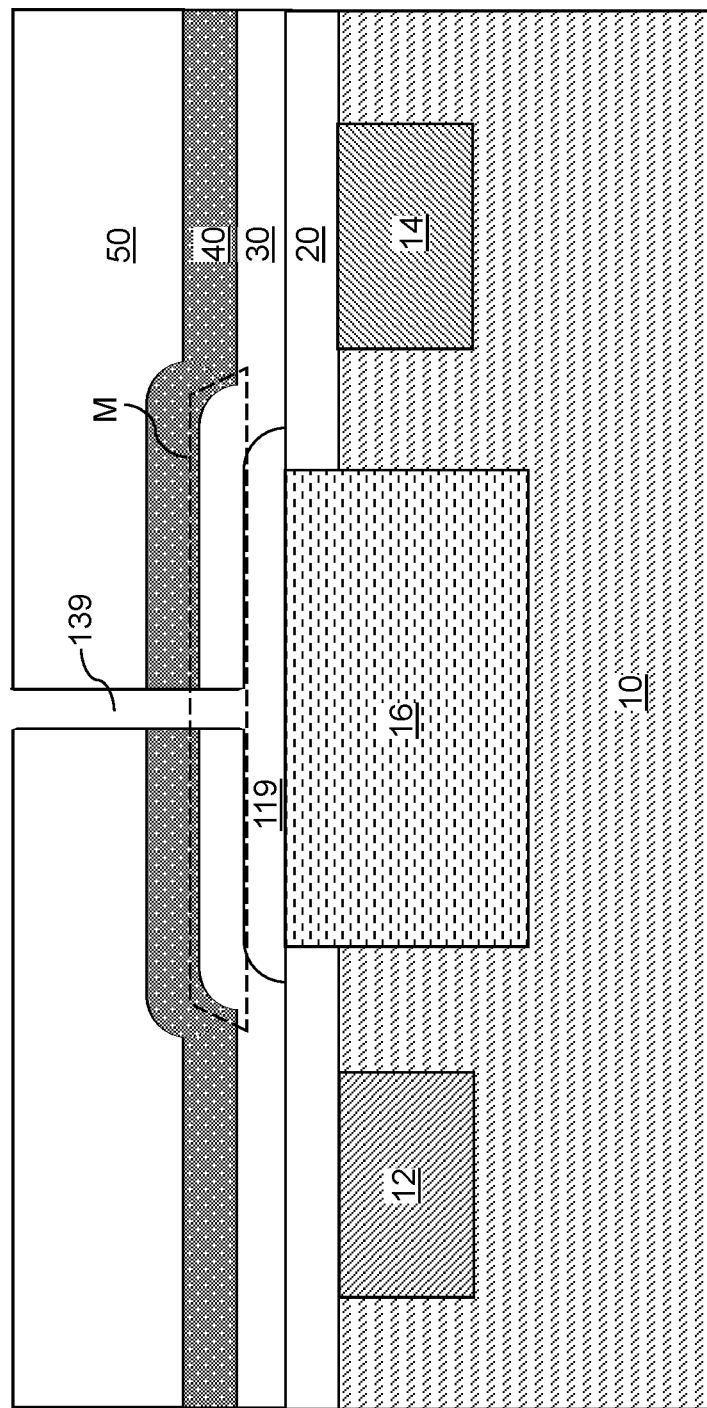

Referring to FIG. 4C, a cavity 119 may be formed by removing the sacrificial material of the capping material layer 118 selective to the materials of the germanium-containing material portion 16, the silicon oxide layer 20, the third dielectric material layer 50, the second dielectric material layer 40, and the first dielectric material layer 30. The removal of the sacrificial material of the capping material layer 118 may be effected, for example, by an isotropic etch process that etches the sacrificial material selective to the materials of the germanium-containing material portion 16, the silicon oxide layer 20, and the first dielectric material layer 30. The isotropic etch process may use a wet etch process or a chemical dry etch (CDE) process. In embodiments in which the capping material layer 118 include amorphous carbon or diamond-like carbon, an ashing process may be used in lieu of an isotropic etch process. The cavity 119 includes a volume from which the capping material layer 118 is removed. The cavity 119 comprises a laterally-extending cavity overlying the entire area of the top surface of the germanium-containing material portion 16 and peripheral areas of the silicon oxide layer 20 that are proximal to the germanium-containing material portion 16.

Figure 4D:
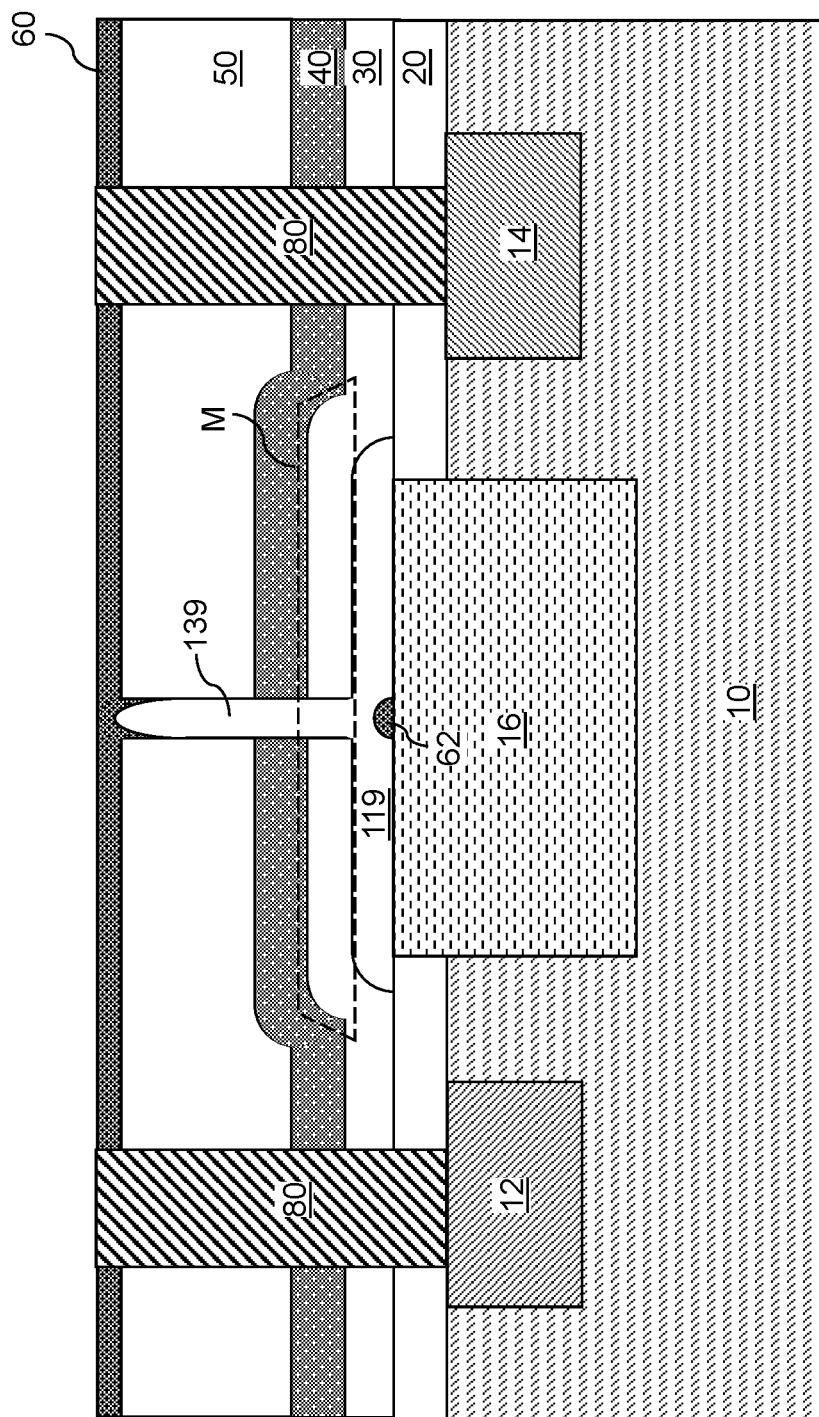

Referring to FIG. 4D, a fourth dielectric material layer 60 may be deposited by a non-conformal deposition process such as a plasma-enhanced chemical vapor deposition (PECVD) process or a physical vapor deposition (PVD) process. The fourth dielectric material layer 60 includes a dielectric material such as silicon nitride, silicon oxide, silicon carbide, silicon carbide nitride, or a dielectric metal oxide. The anisotropic deposition process used to deposit the fourth dielectric material layer 60 deposits the dielectric material on each sidewall of the at least one via cavity 139 such that each via cavity 139 is sealed with the fourth dielectric material layer 60. Generally, the at least one via cavity 139 may be sealed by anisotropically depositing the fourth dielectric material layer 60. The top portion of each of the at least one via cavity 139 may be sealed by the fourth dielectric material layer 60. The cavity 119 becomes an encapsulated cavity that is encapsulated by the germanium-containing material portion 16, the silicon oxide layer 20, the first dielectric material layer 30, the second dielectric material layer 40, the third dielectric material layer 50, and the fourth dielectric material layer 60. The cavity 119 includes a laterally-extending portion that overlies the germanium-containing material portion 16 and at least one vertically-protruding portion including an unfilled volume of the respective via cavity 139.

A downward-protruding portion of the fourth dielectric material layer 60 may contact a sidewall of a respective one of the at least one via cavity 139. Portions of the dielectric material of the fourth dielectric material layer 60 that pass through the at least one via cavity 139 may be deposited at the bottom of the cavity 119 to form at least one discrete dielectric material portion 62 surrounded by the encapsulated cavity 119. Each discrete dielectric material portion 62 may have the same material composition as the fourth dielectric material layer 60, and may underlie a respective one of the at least one via cavity 139. Each discrete dielectric material portion 62 may contact a top surface of the silicon oxide layer 20 and/or a top surface of the germanium-containing material portion 16. In one embodiment, the laterally-extending portion of the encapsulated cavity 119 may have a uniform height between the top surface of the germanium-containing material portion 16 and a bottom surface of the mesa region M of the first dielectric material layer 30.

Various contact via structures 80 may be formed through the fourth, third, second, and first dielectric material layers (60, 50, 40, 30) and through the silicon oxide layer 20 directly on a top surface of a respective one of the at least one doped silicon region (12, 14). Optionally, the top surface of the fourth dielectric material layer 60 may be planarized.

Figure 4E:
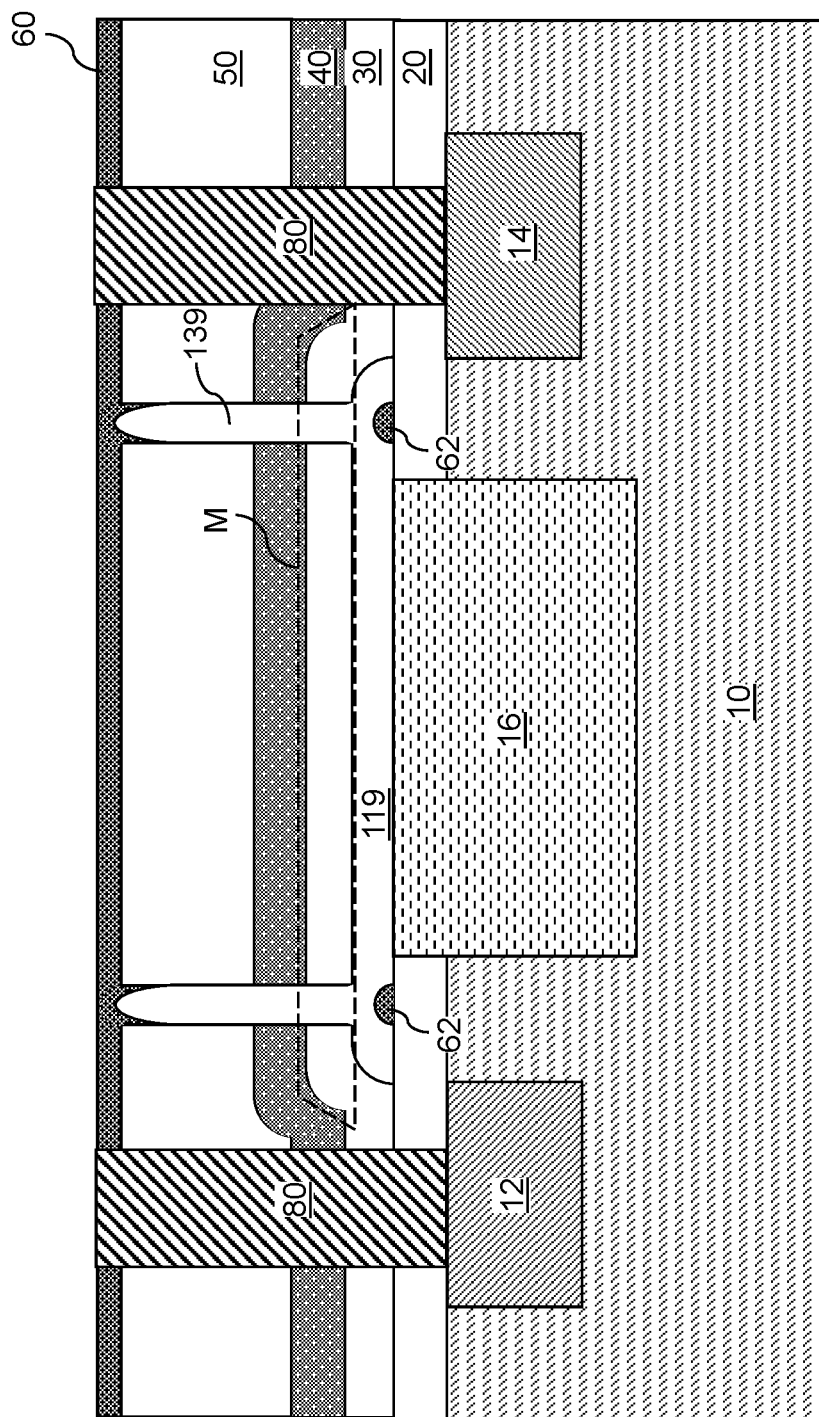
FIGS. 4E-4G are alternative configurations of the fourth exemplary structure according to the third embodiment of the present disclosure.

FIG. 4E illustrates a first alternative configuration of the fourth exemplary structure, in which the via cavities 139 are formed over the area of the silicon oxide layer 20 outside the area of the germanium-containing material portion 16. In this embodiment, the discrete dielectric material portions 62 may be formed on the top surface of the silicon oxide layer 20.

Figure 4F:
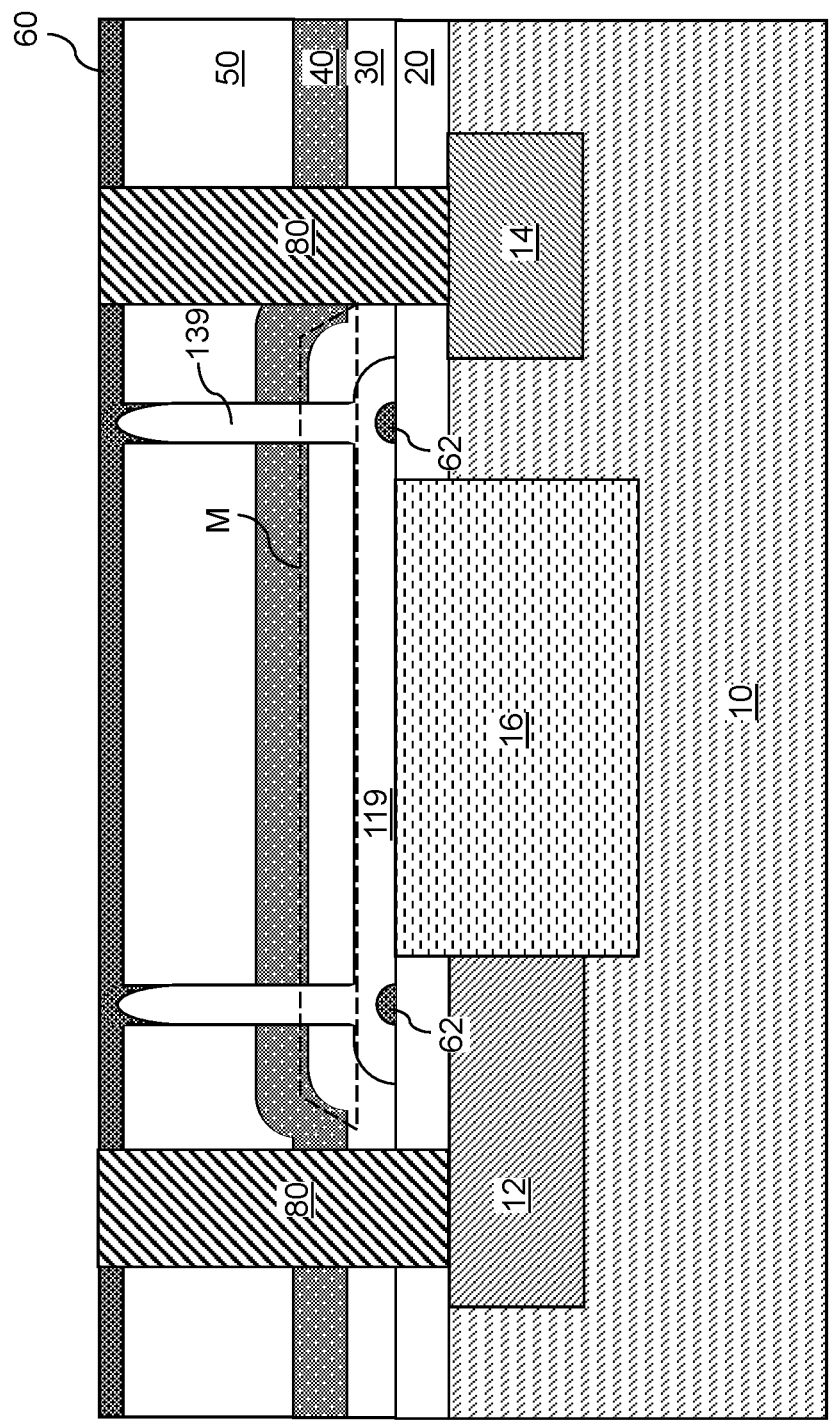

FIG. 4F illustrates a second alternative configuration of the fourth exemplary structure, in which a first doped silicon portion 12 having a doping of the first conductivity type contacts a sidewalls of the germanium-containing material portion 16. The second alternative configuration of the fourth exemplary structure may be derived from any of the previously described configurations of the fourth exemplary structure by providing direct contact between the first doped silicon portion 12 and the germanium-containing material portion 16. The germanium-containing material portion 16 may be intrinsic, p-doped, or n-doped, and a p-n junction, a p-i junction, or an n-i junction may, or may not, be present at an interface between the first doped silicon portion 12 and the germanium-containing material portion 16.

Figure 4G:
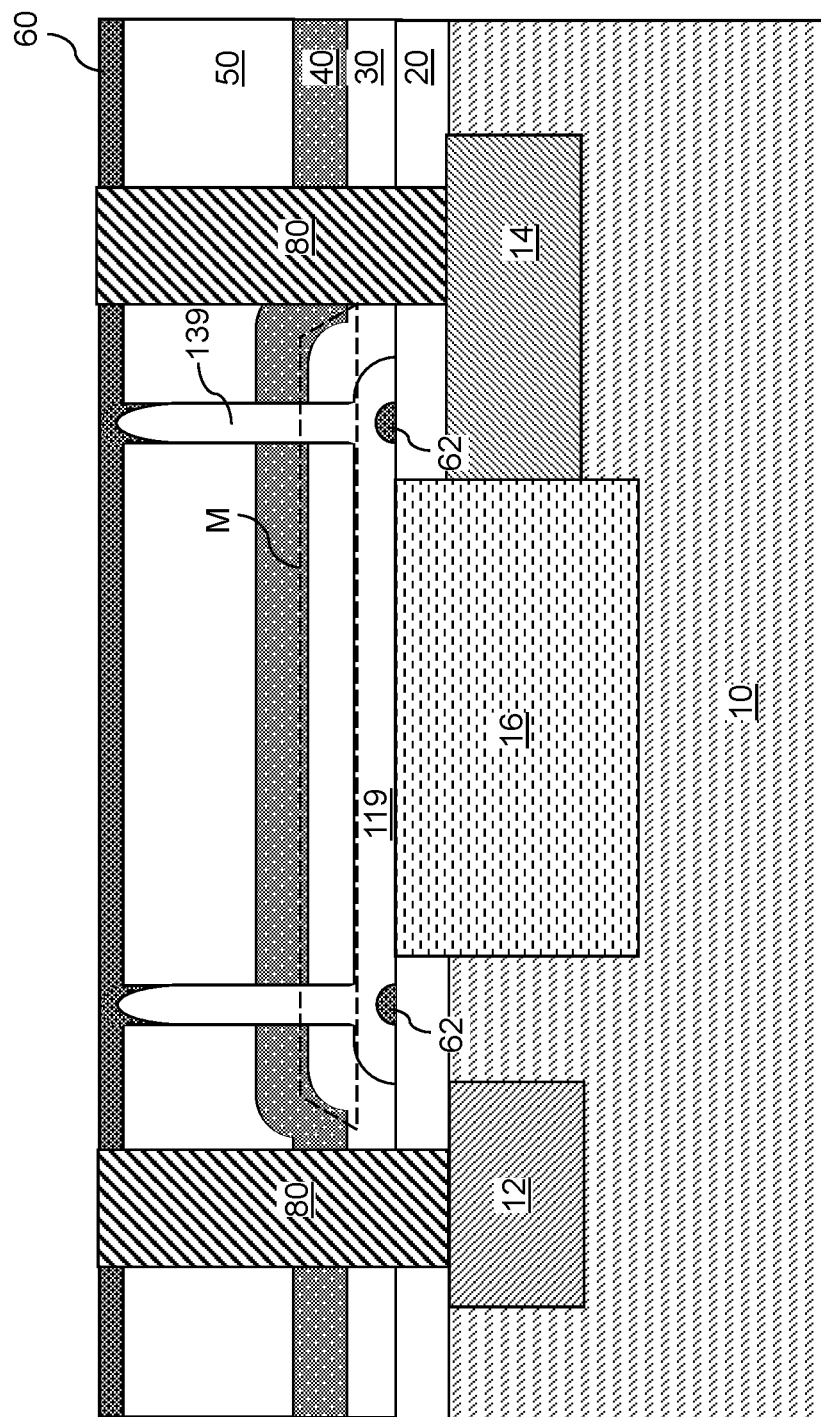

FIG. 4G illustrates a third alternative configuration of the fourth exemplary structure, in which a second doped silicon portion 14 having a doping of the second conductivity type contacts a sidewalls of the germanium-containing material portion 16. The third alternative configuration of the fourth exemplary structure may be derived from any of the previously described configurations of the fourth exemplary structure by providing direct contact between the second doped silicon portion 14 and the germanium-containing material portion 16. The germanium-containing material portion 16 may be intrinsic, p-doped, or n-doped, and a p-n junction, a p-i junction, or an n-i junction may, or may not, be present at an interface between the second doped silicon portion 14 and the germanium-containing material portion 16.

In various configurations of the fourth exemplary structure, the second dielectric material layer 40 may overlie the first dielectric material layer 30, and may vertically protrude away from the germanium-containing material portion 16 over the mesa region M. In other words, the second dielectric material layer 40 may have another mesa region that overlies the mesa region M of the first dielectric material layer 30. The third dielectric material layer 50 overlies the second dielectric material layer 40. The fourth dielectric material layer 60 overlies the third dielectric material layer 50. The at least one via cavity 139 vertically extends through the second dielectric material layer 40 and the third dielectric material layer 50, and a portion of the fourth dielectric material layer 60 contacts a sidewall of each of the at least one via cavity 139.

The various features of different configurations of the exemplary structures of the present disclosure may be combined to generate derived configurations that include multiple features of two or more configurations.

Referring collectively to FIGS. 2A-4F and according to various configurations of the present disclosure, a semiconductor device is provided, which comprises: a semiconductor substrate including a silicon layer 10 and a germanium-containing material portion 16 laterally surrounded by the silicon layer 10; a silicon oxide layer 20 overlying the semiconductor substrate, wherein the germanium-containing material portion 16 is laterally surrounded by the silicon oxide layer 20; and a first dielectric material layer 30 overlying the silicon oxide layer 20 and including a mesa region M that is raised from the germanium-containing material portion 16, wherein an encapsulated cavity 119 that is free of a solid phase material is located between the germanium-containing material portion 16 and the mesa region M of the first dielectric material layer 30, and the encapsulated cavity 119 includes at least one via cavity 39 that extends into the mesa region M of the first dielectric material layer 30. Generally, at least one doped silicon region (12, 14) may be embedded in the silicon layer 10, and the semiconductor structure may comprise a p-n junction or a p-i-n junction located between one of the at least one doped silicon region (12, 14) and the germanium-containing material portion 16.

In one embodiment, a laterally-extending portion of the encapsulated cavity 119 vertically extends between a surface of the germanium-containing material portion 16 and a surface of the first dielectric material layer 30. In one embodiment, a top periphery of the germanium-containing material portion 16 coincides with a closed periphery of a top surface of the silicon oxide layer 20. In one embodiment, the semiconductor device may also include a second dielectric material layer 40 overlying the first dielectric material layer 30, wherein a portion of the second dielectric material layer 40 contacts a sidewall of the at least one via cavity 139. In one embodiment, the semiconductor device may also include a discrete dielectric material portion 42, 62 surrounded by the encapsulated cavity 119, having a same material composition as the second dielectric material layer 40, underlying one of the at least one via cavity 39, 139, and contacting a top surface of the silicon oxide layer 20 or a top surface of the germanium-containing material portion 16. In one embodiment, the semiconductor device may also include a second dielectric material layer 40 overlying the first dielectric material layer 30 and vertically protruding away from the germanium-containing material portion 16 over the mesa region; a third dielectric material layer 50 overlying the second dielectric material layer 40; and a fourth dielectric material layer 60 overlying the third dielectric material layer 50, wherein the at least one via cavity 139 vertically extends into the second dielectric material layer 40 and the third dielectric material layer 50, and a portion of the fourth dielectric material layer 60 contacts a sidewall of the at least one via cavity 139. In one embodiment, the semiconductor device may also include at least one doped silicon region 12, 14 in the silicon layer 10, wherein the semiconductor device comprises a p-n junction or a p-i-n junction located between one of the at least one doped silicon region 12, 14 and the germanium-containing material portion 16. In one embodiment, the silicon layer 10 comprises a single crystalline silicon material; and the germanium-containing material portion 16 comprises a single crystalline silicon-germanium alloy or a single crystalline germanium material portion, and is epitaxially aligned to the single crystalline silicon material.

Figure 5:
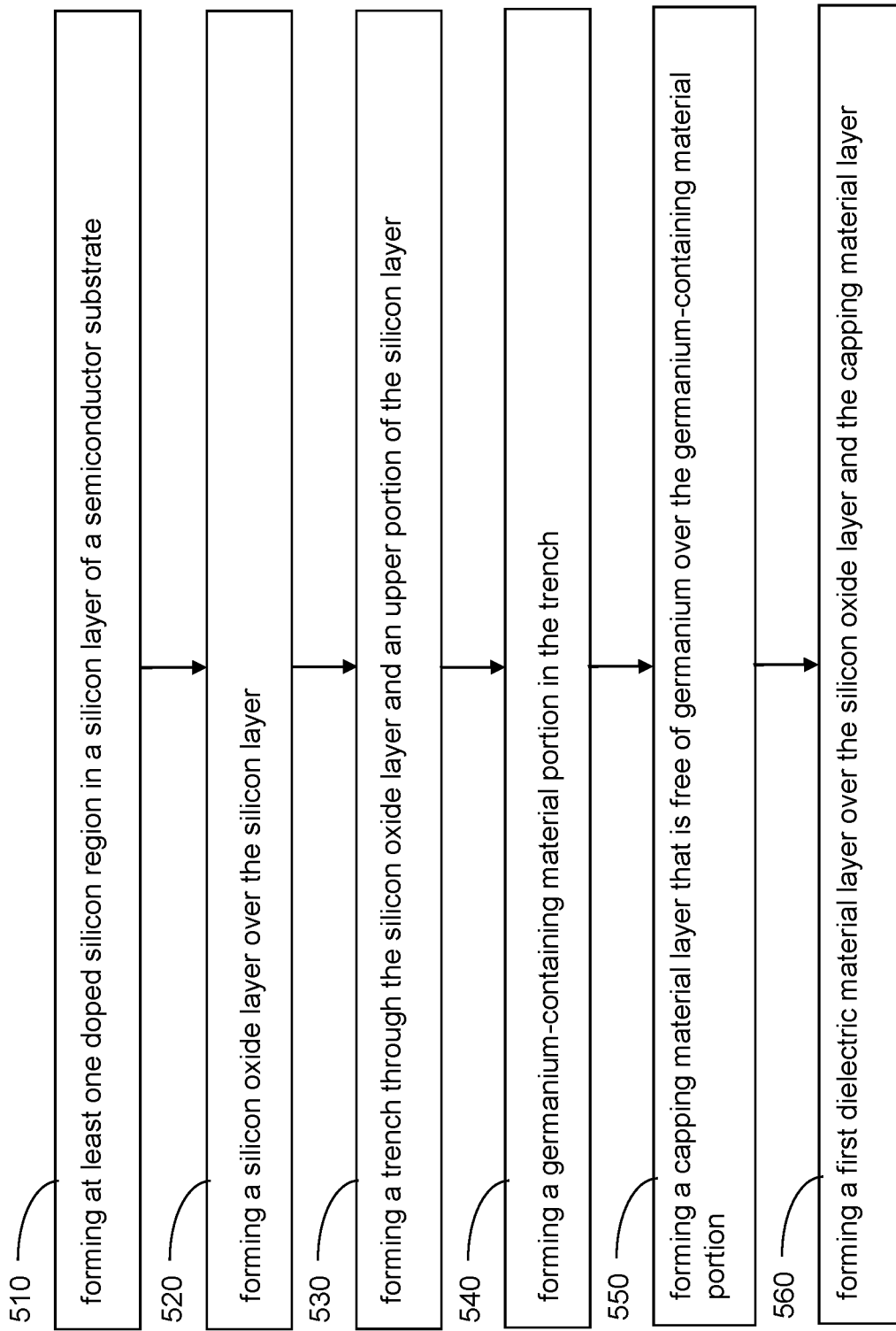
FIG. 5 is a process flow diagram illustrating an exemplary process sequence for forming a semiconductor structure according to an embodiment of the present disclosure.

Referring to FIG. 5, a process flow diagram illustrating an exemplary process sequence for forming a semiconductor device according to an embodiment of the present disclosure. Referring to step 510 and FIG. 1A, at least one doped silicon region (12, 14) may be formed in a silicon layer 10 of a semiconductor substrate. Referring to step 520 and FIG. 1B, a silicon oxide layer 20 may be formed over the silicon layer 10. Referring to step 530 and FIG. 1B, a trench 11 may be formed through the silicon oxide layer 20 and an upper portion of the silicon layer 10. Referring to step 540 and FIGS. 1C, 1F-1I, 2A, 2F-2J, 3A, 4A, and 4E-4G, a germanium-containing material portion 16 is formed in the trench 11. A p-n junction or a p-i-n junction including the germanium-containing material portion 16 and one of the at least one doped silicon region (12, 14) is formed. Referring to step 550 and FIGS. 1D, 1F-1I, 2A, 2F-2J, 3A, 4A, and 4E-4G, a capping material layer (18 or 118) that is free of germanium may be formed over (and directly on) the germanium-containing material portion 16. Referring to step 560 and FIGS. 1E-1I, 2B, 2F-2J, 3A, 4A, and 4E-4G, a first dielectric material layer 30 may be formed over the silicon oxide layer 20 and the capping material layer (18 or 118). The first dielectric material layer 30 includes a mesa region M that is raised from the germanium-containing material portion 16 by a thickness of the capping material layer (18 or 118). The capping material layer (18 or 118) may be formed as a permanent structure such as a silicon capping layer, or may be formed as a sacrificial structure that is replaced with a cavity 119.

In one embodiment, the entirety of the top surface of the germanium-containing material portion 16 is in contact with a silicon capping layer including silicon at an atomic percentage greater than 99%, or is in contact with a cavity 119 that is free of any solid phase material. Generation of dark current from an interface between a germanium-containing material portion 16 and a silicon capping layer is very small, and minimizes adverse noise generation in a semiconductor device including a photovoltaic junction. Further, generation of dark current from an interface between a germanium-containing material portion 16 and a cavity 119 is negligible. Thus, embodiments of the present disclosure may provide semiconductor devices with reduced dark current generation and having higher signal-to-noise ratios in photovoltaic devices.

The various embodiments disclosed herein provide semiconductor photodetector structures that include a germanium-containing material portion. The various embodiments include either a silicon cap or an air gap as a germanium protection layer. The silicon cap may provide a better lattice constant as compared to germanium. Other embodiments utilize an air cap as a germanium protection layer. The air cap may provide a smaller refractive index to improve the total reflection. In the various embodiments, the silicon cap and/or air cap provides better reflection characteristics, prevents seam defects from occurring in conventional silicon nitride caps, and reduces light loss and dark current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate including a silicon layer and a germanium-containing material portion laterally surrounded by the silicon layer;
a silicon oxide layer overlying the semiconductor substrate, wherein the germanium-containing material portion is laterally surrounded by the silicon oxide layer; and
a first dielectric material layer overlying the silicon oxide layer and including a mesa region that is raised from the germanium-containing material portion, wherein an encapsulated cavity that is free of a solid phase material is located between the germanium-containing material portion and the mesa region of the first dielectric material layer, and the encapsulated cavity includes at least one via cavity that extends into the mesa region of the first dielectric material layer.

2. The semiconductor device of claim 1, wherein a laterally-extending portion of the encapsulated cavity vertically extends between a surface of the germanium-containing material portion and a surface of the first dielectric material layer.

3. The semiconductor device of claim 2, wherein a top periphery of the germanium-containing material portion coincides with a closed periphery of a top surface of the silicon oxide layer.

4. The semiconductor device of claim 1, further comprising a second dielectric material layer overlying the first dielectric material layer, wherein a portion of the second dielectric material layer contacts a sidewall of the at least one via cavity.

5. The semiconductor device of claim 4, further comprising a discrete dielectric material portion surrounded by the encapsulated cavity, having a same material composition as the second dielectric material layer, underlying one of the at least one via cavity, and contacting a top surface of the silicon oxide layer or a top surface of the germanium-containing material portion.

6. The semiconductor device of claim 1, further comprising:
a second dielectric material layer overlying the first dielectric material layer and vertically protruding away from the germanium-containing material portion over the mesa region;
a third dielectric material layer overlying the second dielectric material layer; and
a fourth dielectric material layer overlying the third dielectric material layer, wherein the at least one via cavity vertically extends into the second dielectric material layer and the third dielectric material layer, and a portion of the fourth dielectric material layer contacts a sidewall of the at least one via cavity.

7. The semiconductor device of claim 1, further comprising at least one doped silicon region embedded in the silicon layer, wherein the semiconductor device comprises a p-n junction or a p-i-n junction located between one of the at least one doped silicon region and the germanium-containing material portion.

8. The semiconductor device of claim 1, wherein:
the silicon layer comprises a single crystalline silicon material; and
the germanium-containing material portion comprises a single crystalline silicon-germanium alloy or a single crystalline germanium material portion, and is epitaxially aligned to the single crystalline silicon material.

9. A method of forming a semiconductor device, comprising:
forming at least one doped silicon region in a silicon layer of a semiconductor substrate;
forming a silicon oxide layer over the silicon layer;
forming a trench through the silicon oxide layer and an upper portion of the silicon layer;
forming a germanium-containing material portion in the trench, wherein a p-n junction or a p-i-n junction including the germanium-containing material portion and one of the at least one doped silicon region is formed;
forming a capping material layer that is free of germanium over the germanium-containing material portion;
forming a first dielectric material layer over the silicon oxide layer and the capping material layer, wherein the first dielectric material layer includes a mesa region that is raised from the germanium-containing material portion by a thickness of the capping material layer;
forming at least one via cavity through the first dielectric material layer; and
forming a laterally-extending cavity by removing the capping material layer selective to the germanium-containing material portion and the first dielectric material layer.

10. The method of claim 9, wherein the capping material layer covers an entirety of the top surface of the germanium-containing material portion.

11. The method of claim 9, wherein:
the silicon layer comprises a single crystalline silicon material; and
the germanium-containing material portion comprises a single crystalline silicon-germanium alloy or a single crystalline germanium material portion, and is epitaxially aligned to the single crystalline silicon material.

12. The method of claim 9, further comprising sealing the at least one via cavity by anisotropically depositing an additional dielectric material layer, wherein a top portion of each of the at least one via cavity is sealed by the additional dielectric material layer and an encapsulated cavity that is encapsulated by the germanium-containing material portion, the silicon oxide layer, the first dielectric material layer, and the additional dielectric material layer is formed.

13. The method of claim 9, wherein the capping material layer comprises a silicon capping layer.

14. The semiconductor device of claim 1, wherein a top surface of the germanium-containing material portion is located within a same horizontal plane as a top surface of the silicon oxide layer.

15. The semiconductor device of claim 1, wherein:
a bottommost surface of the first dielectric material layer contacts a first segment of a top surface of the silicon oxide layer; and
a bottom surface of the mesa region of the first dielectric material layer is located above a horizontal plane including the top surface of the silicon oxide layer.

16. The semiconductor device of claim 1, wherein a second segment the top surface of the silicon oxide layer is laterally surrounded by the first segment of the top surface of the silicon oxide layer, and is physically exposed to the encapsulated cavity.

17. The semiconductor device of claim 1, wherein a horizontal cross-sectional area of each of the at least one via cavity within the mesa region of the first dielectric material layer decreases with a vertical distance from the semiconductor substrate.

18. The semiconductor device of claim 4, wherein:
the portion of the second dielectric material layer that contacts the sidewall of the at least one via cavity has a variable lateral thickness between a vertical sidewall that contacts the sidewall of the at least one via cavity and a tapered sidewall that is exposed to the at least one via cavity; and
the variable lateral thickness increases with a vertical distance from the semiconductor substrate.

19. The semiconductor device of claim 5, wherein:
the discrete dielectric material portion has a variable thickness that increased with a lateral distance from a bottom periphery of the discrete dielectric material portion toward a center portion of the discrete dielectric material portion; and
a top surface of the discrete dielectric material portion is exposed to the encapsulated cavity.

20. A semiconductor device comprising:
a semiconductor substrate including a silicon layer and a germanium-containing material portion laterally surrounded by the silicon layer;
a silicon oxide layer overlying the semiconductor substrate, wherein the germanium-containing material portion is laterally surrounded by the silicon oxide layer;
a first dielectric material layer overlying the silicon oxide layer and including a mesa region that is raised from the germanium-containing material portion, wherein an encapsulated cavity that is free of a solid phase material is located between the germanium-containing material portion and the mesa region of the first dielectric material layer, and the encapsulated cavity includes at least one via cavity that extends into the mesa region of the first dielectric material layer; and
a discrete dielectric material portion surrounded by the encapsulated cavity, underlying one of the at least one via cavity, and contacting a top surface of the silicon oxide layer or a top surface of the germanium-containing material portion.

* * * * *